US012729435B2

(12) United States Patent
Vervuurt et al.

(10) Patent No.: US 12,729,435 B2
(45) Date of Patent: Sep. 8, 2026

(54) METHODS FOR DEPOSITING GAP-FILLING FLUIDS AND RELATED SYSTEMS AND DEVICES

(71) Applicant: ASM IP Holding, B.V., Almere (NL)

(72) Inventors: René Henricus Jozef Vervuurt, Leuven (BE); Timothee Blanquart, Oud-Heverlee (BE); Viljami Pore, Helsinki (FI)

(73) Assignee: ASM IP Holding B.V., Almere (NL)

( * ) Notice: Subject to any disclaimer, the term of this patent is extended or adjusted under 35 U.S.C. 154(b) by 612 days.

(21) Appl. No.: 18/148,568

(22) Filed: Dec. 30, 2022

(65) Prior Publication Data

US 2023/0212744 A1 Jul. 6, 2023

Related U.S. Application Data

(60) Provisional application No. 63/295,990, filed on Jan. 3, 2022.

(51) Int. Cl.

| | |
|---|---|
| ***C23C 16/455*** | (2006.01) |
| ***H10P 14/60*** | (2026.01) |
| ***H10W 10/00*** | (2026.01) |
| ***H10W 10/17*** | (2026.01) |

(52) U.S. Cl.
CPC .... *C23C 16/45542* (2013.01); *H10P 14/6336* (2026.01); *H10P 14/6339* (2026.01); *H10P 14/6532* (2026.01); *H10W 10/014* (2026.01); *H10W 10/17* (2026.01)

(58) Field of Classification Search
CPC ........ C23C 16/45542; C23C 16/45523; C23C 16/045; C23C 16/45553; C23C 16/515; C23C 16/505; C23C 16/45534; C23C 16/52; C23C 16/45531; C23C 16/45538; C23C 16/4586; C23C 16/5096; H01L 21/02274; H01L 21/0228; H01L 21/0234; H01L 21/76224; H01L 21/02126; H01L 21/02222; H01L 21/02183; H01L 21/02186; H01L 21/02216; H01L 21/02205; H01L 21/76837; H01J 37/32449; H10P 14/6336; H10P 14/6339; H10P 14/6532; H10P 14/6686; H10P 14/6689; H10P 14/6922; H10P 14/69393; H10P 14/69394; H10P 14/668; H10W 10/014; H10W 10/17; H10W 20/098
See application file for complete search history.

(56) References Cited

U.S. PATENT DOCUMENTS

| | | | | |
|---|---|---|---|---|
| 9,892,964 | B1 | 2/2018 | Moon | |
| 2016/0093488 | A1* | 3/2016 | Thadani | H01L 21/76224 438/786 |
| 2019/0055645 | A1* | 2/2019 | Li | C23C 16/513 |
| 2019/0311894 | A1* | 10/2019 | Girard | C23C 16/308 |
| 2019/0341302 | A1* | 11/2019 | Lei | H01L 21/76837 |
| 2020/0118815 | A1* | 4/2020 | Fukazawa | H01L 21/02274 |

(Continued)

FOREIGN PATENT DOCUMENTS

| | | |
|---|---|---|
| JP | 2022111764 A | 8/2022 |
| WO | 2022158331 A1 | 7/2022 |

*Primary Examiner* — Julia Slutsker
(74) *Attorney, Agent, or Firm* — Banner & Witcoff, Ltd.

(57) ABSTRACT

Methods and systems for filling a gap comprised in the substrate with a gap filling fluid. The gap filling fluid is formed in a plasma with a first precursor and a second precursor.

20 Claims, 13 Drawing Sheets

(56) References Cited

U.S. PATENT DOCUMENTS

| | | | | |
|---|---|---|---|---|
| 2020/0385865 | A1* | 12/2020 | Jiang | H01L 21/02211 |
| 2021/0288086 | A1* | 9/2021 | Li | H10F 39/8067 |
| 2022/0235456 | A1 | 7/2022 | Matsuki | |
| 2022/0267642 | A1* | 8/2022 | Vrtis | H01L 21/02274 |
| 2023/0260834 | A1* | 8/2023 | Brogan | C23C 16/45553<br>118/715 |

* cited by examiner

| Monomer Content | SiC | C | SiCO | SiCN | SiN | Si | BN | CON |
|---|---|---|---|---|---|---|---|---|
| SiC | | | | | | | | |
| C | | | | | | | | |
| SiCO | | | | | | | | |
| SiCN | | | | | | | | |
| SiN | | | | | | | | |
| Si | | | | | | | | |
| BN | | | | | | | | |
| CON | | | | | | | | |

METHODS FOR DEPOSITING GAP-FILLING FLUIDS AND RELATED SYSTEMS AND DEVICES

CROSS REFERENCE TO RELATED APPLICATIONS

This Application claims the benefit of U.S. Provisional Application 63/295,990 filed on Jan. 3, 2022. The entire contents of this application is incorporated herein by reference in its entirety.

FIELD OF INVENTION

The present disclosure generally relates to methods and systems suitable for forming electronic devices. More particularly, the disclosure relates to methods and systems that can be used for forming a material in gaps, trenches, and the like by plasma-assisted deposition processes and the like.

BACKGROUND OF THE DISCLOSURE

Flowable materials, or gap filling fluids, are commonly used for filling small gaps or recesses in semiconductor device processing. However, only a limited amount of materials can be formed using gap filling fluid-based processes of the prior art. Furthermore, it can be difficult to control the composition of the materials that are formed. In particular, the elemental composition of the gap filling fluid is often very similar to the elemental composition of the precursor which is used in the corresponding process.

One way in which techniques of the prior art attempt to control composition in the materials formed using a gap filling fluid-based process is to use a plasma treatment. Plasma treatments can suitably change the nitrogen and oxygen content, but can come at the cost of reduced flowability. Also plasma treatments typically remove carbon such that forming materials with high carbon content can be impractical with a flowable process.

Any discussion, including discussion of problems and solutions, set forth in this section has been included in this disclosure solely for the purpose of providing a context for the present disclosure. Such discussion should not be taken as an admission that any or all of the invention was previously known or otherwise constitutes prior art.

SUMMARY OF THE DISCLOSURE

Various embodiments of the present disclosure relate to gap filling methods, to structures and devices formed using such methods, and to apparatus for performing the methods and/or for forming the structure and/or devices. The ways in which various embodiments of the present disclosure address drawbacks of prior methods and systems are discussed in more detail below.

Particularly described herein is a method of filling a gap. The method comprises introducing a substrate in a reaction chamber. The substrate is provided with a gap. The method further comprises introducing a reaction gas in the reaction chamber. The reaction gas comprises a noble gas, a first precursor and a second precursor. The first precursor is different from the second precursor. The method further comprises generating a plasma in the reaction chamber. Thus, a gap filling fluid is formed that at least partially fills the gap. The first precursor and the second precursor have a molar mass of at least 50 g/mol.

Further described herein is a further method of filling a gap. The method comprises introducing a substrate in a reaction chamber. The substrate is provided with a gap. The method further comprises introducing a reaction gas in the reaction chamber. The reaction gas comprises a noble gas, a first precursor and a second precursor. The first precursor is different from the second precursor. The method further comprises generating a plasma in the reaction chamber. Accordingly, a gap filling fluid is formed that at least partially fills the gap. It shall be understood that the first precursor and the second precursor comprise at least one of an alkali metal, an alkaline earth metal, boron (B), aluminum (Al), carbon (C), and silicon (Si).

The following embodiments are applicable to any one or both of the aforementioned methods.

In some embodiments, the first precursor comprises a first element and the second precursor comprises a second element. The first element and the second element are different. The first element and the second element are incorporated in the gap filling fluid.

In some embodiments, the reaction gas further comprises a third precursor. The third precursor is different from the first and second precursors. The third precursor comprises a third element. The third element is different from the first element and the second element. The third element is incorporated in the gap filling fluid.

In some embodiments, at least one of the first precursor and the second precursor is selected from the list consisting of hydrocarbons, amines, amides, imides, silanes, alkylsilanes, siloxanes, and borazanes.

In some embodiments, at least one of the first precursor and the second precursor comprises C; Si; Si and C; Si, C, and O; Si, C, and N; Si and N; Si; B and N; or C, O, and N.

In some embodiments, at least one of the first precursor and the second precursor comprises a metal precursor. The metal precursor comprises a metal.

In some embodiments, the metal is selected from an alkali metal, an earth alkali metal, a transition metal, a lanthanide, and a post transition metal.

In some embodiments, the metal precursor is selected from the list consisting of: metal halides, metal alkyls, metal alkenyls, metal aryls, metal beta-diketonates, metal alkoxides, and metal aryloxides.

In some embodiments, the plasma is generated intermittently.

In some embodiments, the plasma is generated continuously.

In some embodiments, at least one of the first precursor and the second precursor is intermittently provided to the reaction chamber.

In some embodiments, at least one of the first precursor and the second precursor is continuously provided to the reaction chamber.

In some embodiments, a method as described herein is carried out at a temperature of at least −25° C. to at most 150° C.

In some embodiments, a method as described herein is carried out at a pressure of at least 500 Pa.

In some embodiments, the noble gas is selected from the group consisting of He, Ne, Ar, and Kr.

In some embodiments, the noble gas is Ar.

In some embodiments, the method includes a step of curing the gap filling fluid such that the carbon concentration of the cured gap filling fluid is reduced with respect to the uncured gap filling fluid.

In some embodiments, the substrate comprises a semiconductor.

In some embodiments, a method as described herein comprises one or more cycles. A cycle comprises a gap fill fluid forming step and a curing step. The gap fill fluid forming step comprising introducing the reaction gas in the reaction chamber and generating the plasma in the reaction chamber.

Further described herein is a system. The system comprises a reaction chamber. The reaction chamber comprises a substrate support and an upper electrode. The substrate support comprises a lower electrode. The system further comprises a radio frequency power source arranged for generating a radio frequency power waveform. The system further comprises a gas injection system fluidly coupled to the reaction chamber. The system further comprises a first precursor gas source for introducing a first precursor and optionally a carrier gas in the reaction chamber. The system further comprises a second precursor gas source for introducing a second precursor and optionally a carrier gas in the reaction chamber. The system further comprises an exhaust. The system further comprises a controller that is arranged to cause the system to carry out a method as described herein.

These and other embodiments will become readily apparent to those skilled in the art from the following detailed description of certain embodiments having reference to the attached figures. The invention is not limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

FIG. 1 is a schematic representation of a plasma-enhanced atomic layer deposition (PEALD) apparatus suitable for depositing a structure and/or for performing a method in accordance with at least one embodiment of the present disclosure.

FIGS. 2(*a*) and 2(*b*) illustrate a schematic representation of a precursor supply system using a flow-pass system (FPS) usable in accordance with at least one embodiment of the present disclosure.

Figure 6A:
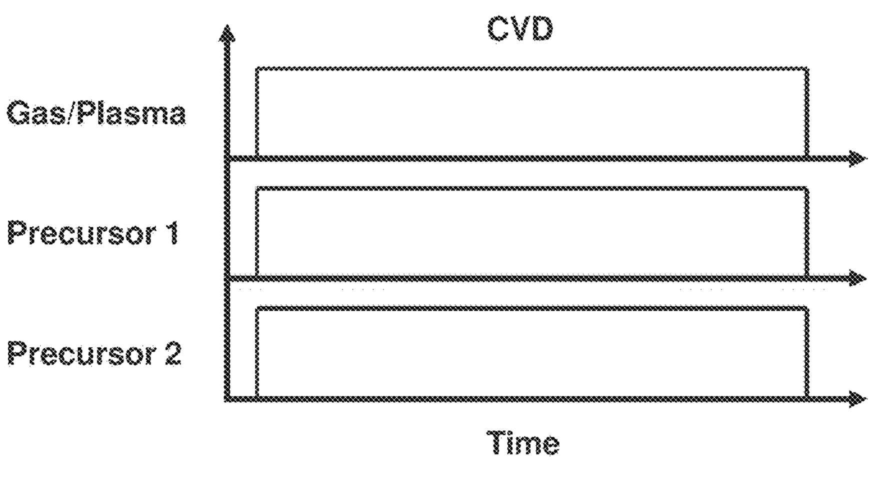
Figure 6B:
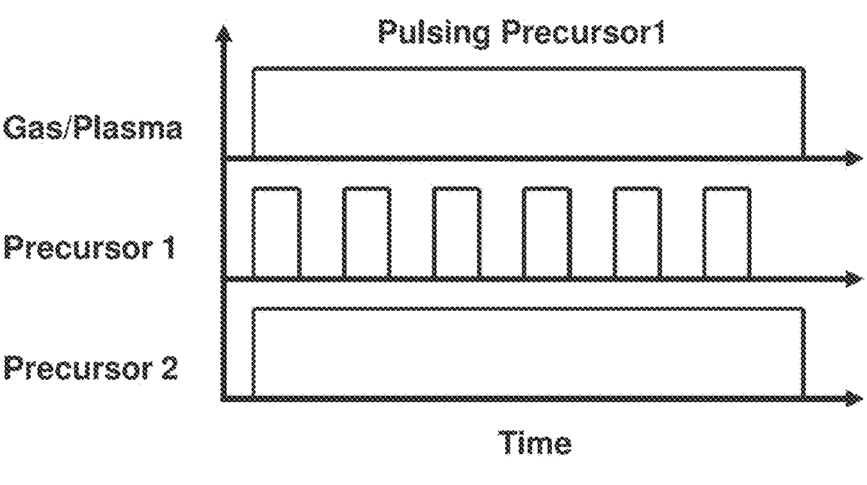
Figure 6C:
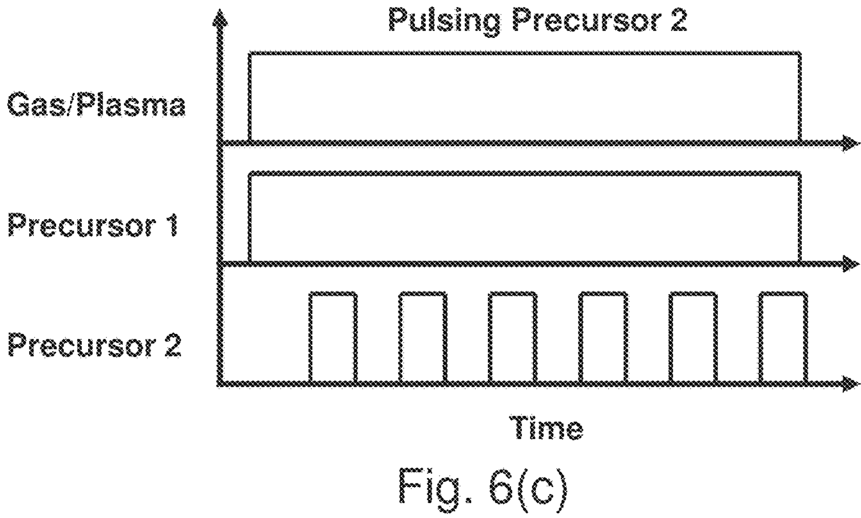

FIGS. 6(*a*)-(*c*) illustrates exemplary pulsing schemes that can be employed in certain embodiments of the methods that are described herein.

Figure 7A:
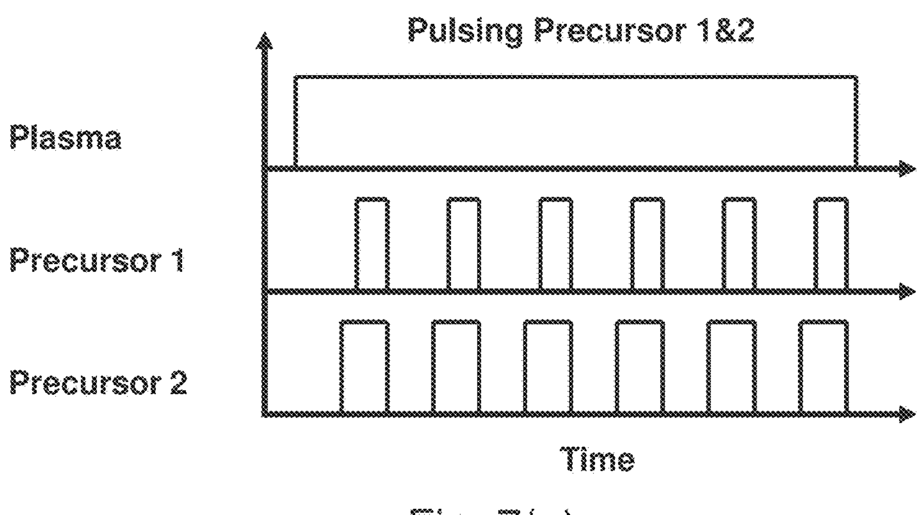
Figure 7B:
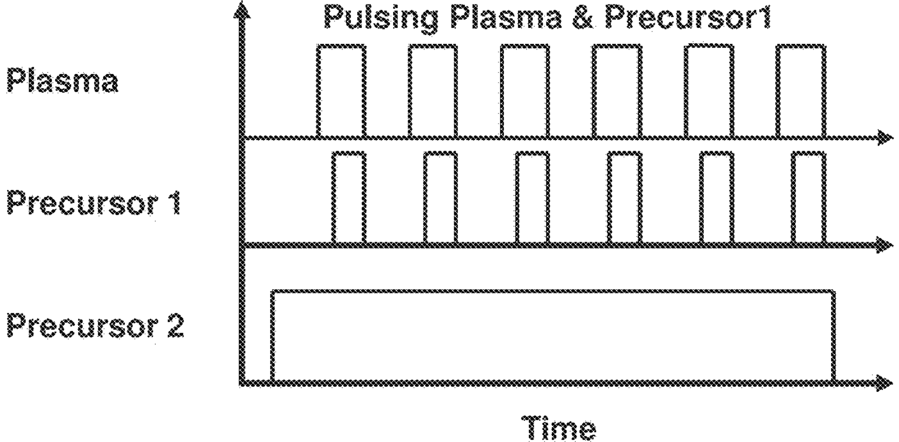
Figure 7C:
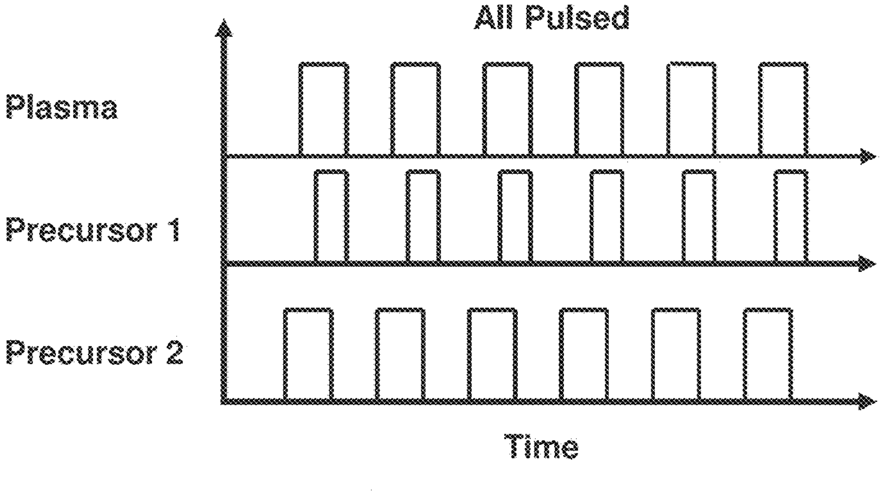

FIGS. 7(*a*)-(*c*) illustrate exemplary pulsing schemes that can be employed in certain embodiments of the methods that are described herein.

Figure 8:
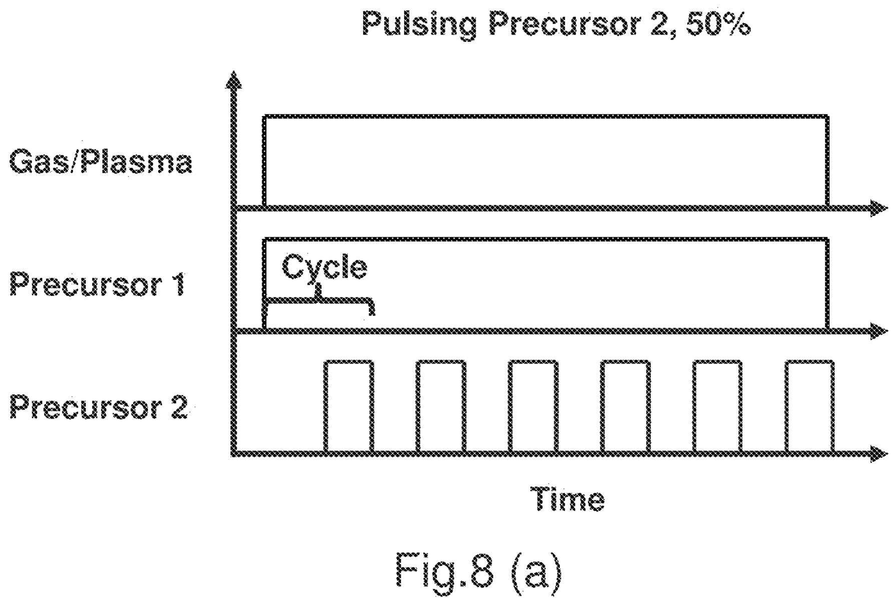
Figure 8B:
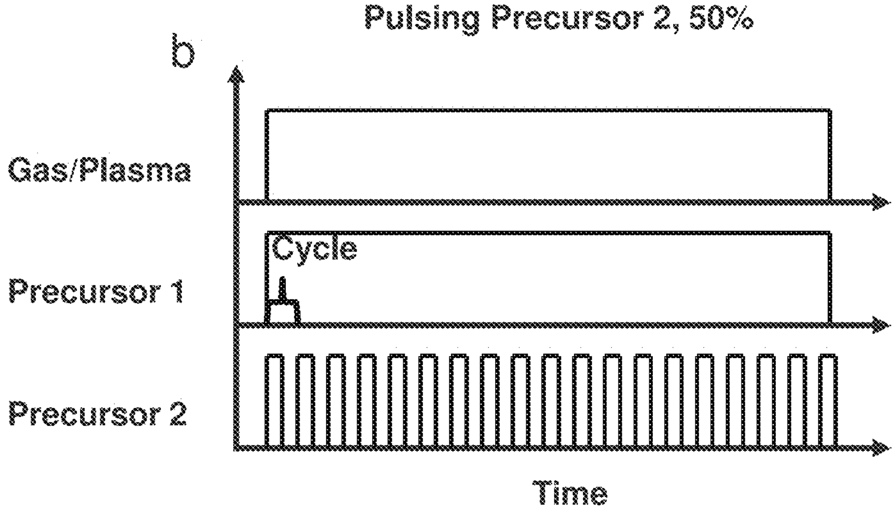

FIGS. 8(*a*) and 8(*b*) illustrate exemplary pulsing schemes that can be employed in certain embodiments of the methods that are described herein.

FIGS. 9(*a*) and 9(*b*) illustrate exemplary pulsing schemes that can be employed in certain embodiments of the methods that are described herein.

Figure 10A:
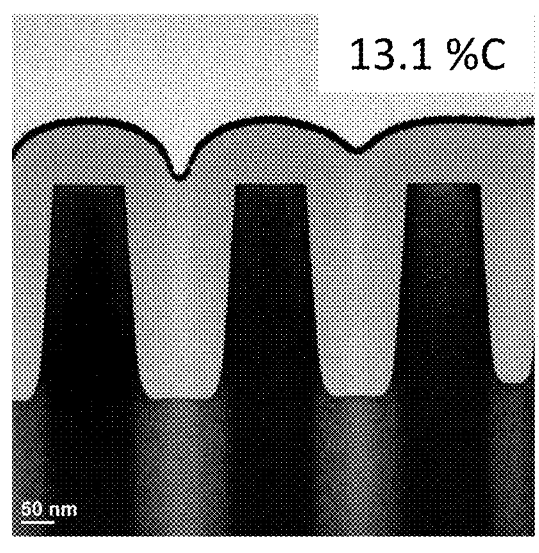
Figure 10B:
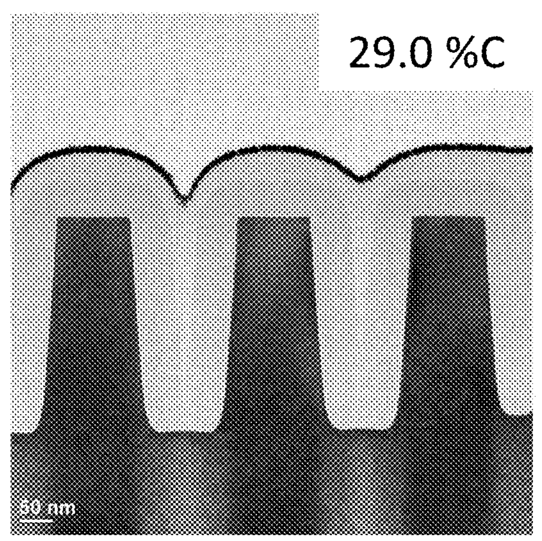
Figure 10C:
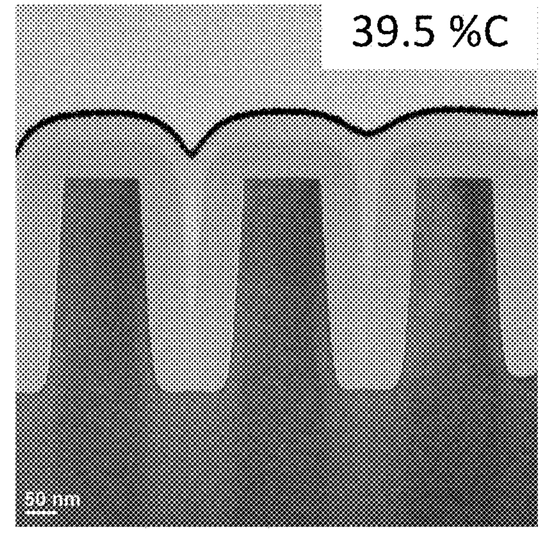

FIGS. 10(*a*)-(*c*) show experimental results that were obtained using embodiments of the methods that are described herein.

FIGS. 11(*a*) and (*b*) show a pulsing scheme and experimental results that were obtained using embodiments of the methods that are described herein.

Figure 12:
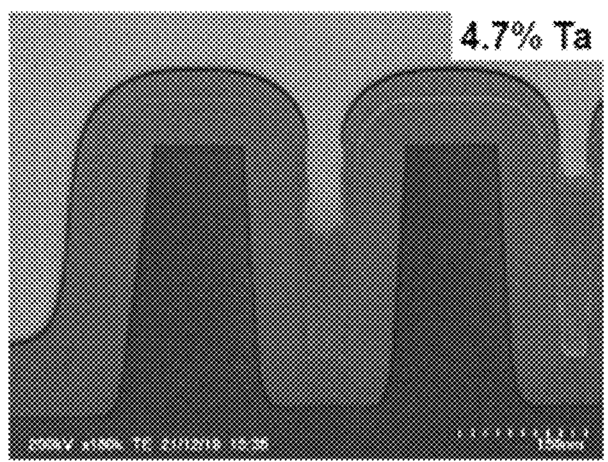

FIG. 12 shows experimental results that were obtained using embodiments of the methods that are described herein.

Figure 13:
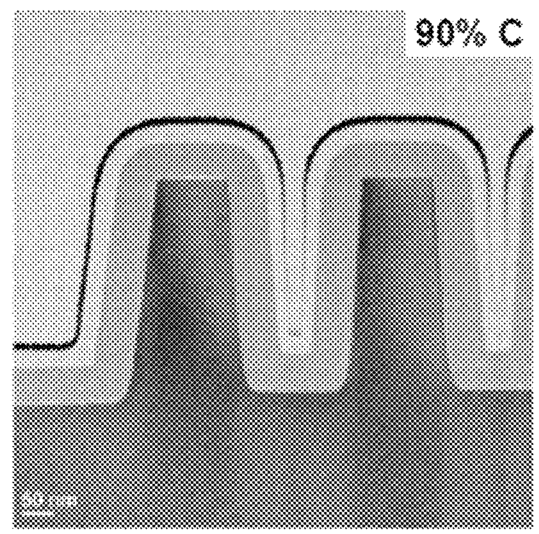

FIG. 13 shows experimental results that were obtained using embodiments of the methods that are described herein.

Figure 14:
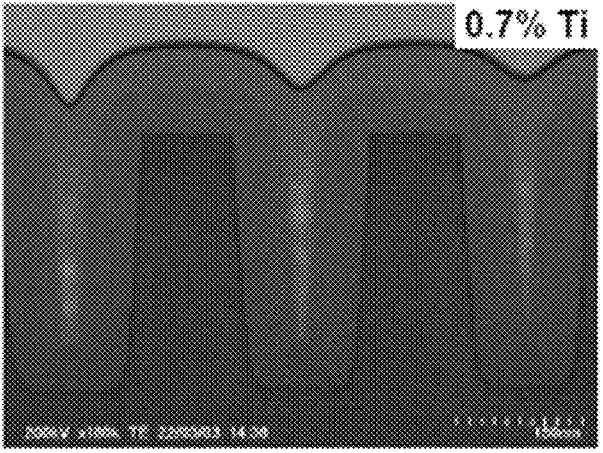

FIG. 14 shows experimental results that were obtained using embodiments of the methods that are described herein.

Figure 15A:
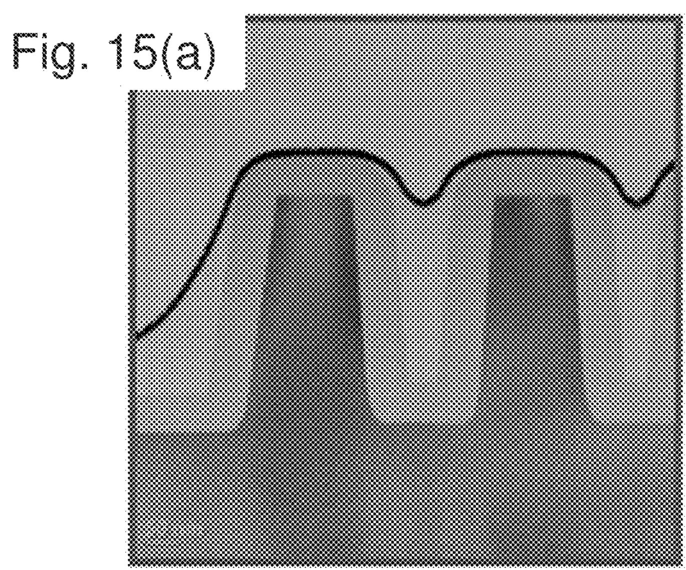
Figure 15B:
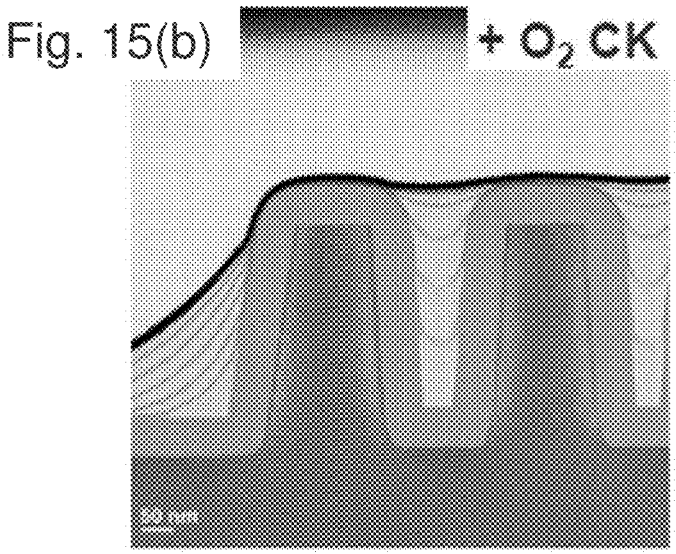
Figure 15C:
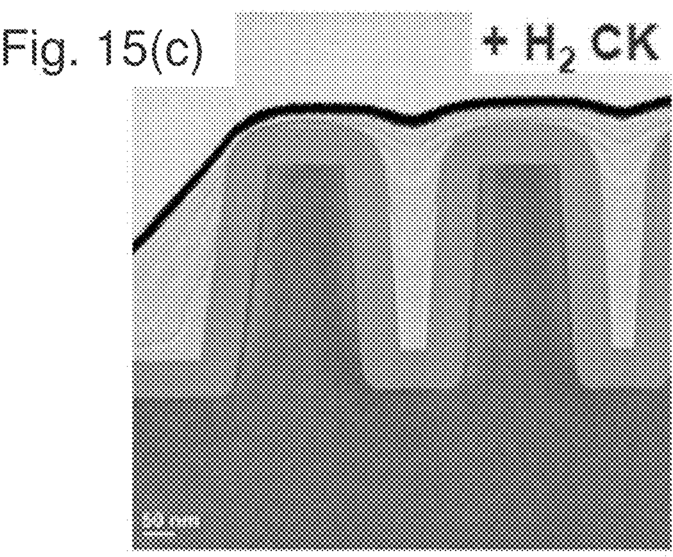

FIGS. 15(*a*)-(*c*) show experimental results that were obtained using embodiments of the methods that are described herein.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, a multi-port injection system, other gas distribution device, or the like, can be used for, e.g., sealing the reaction space, and can include a seal gas, such as a noble gas. In some cases, the term "precursor" can refer to a compound that participates in the chemical reaction that produces another compound, and particularly to a compound that constitutes a film matrix or a main skeleton of a film; the term "reactant" may be used interchangeably with the term precursor.

In some embodiments, the term "reactant" refers to a gas which can react and/or interact with a precursor in order to form a flowable gap fill layer as described herein. The reactant may activate precursor oligomerization. The reactant may be a catalyst. The reactant does not necessarily have to be incorporated in the gap filling fluid which is formed, though the reactant does interact with the precursor during formation of the gap filling fluid. In other words, in some embodiments the reactant is incorporated in the gap filling fluid whereas in other embodiments, the reactant is not, or not substantially, incorporated in the gap filling fluid. Possible reactants include noble gasses, which can be brought in an excited state, in particular an excited state such as ion and/or radical induced by means of a plasma, such as He and Ar, as well as other gasses such as $H_2$. Alternative expressions for the term "reactant" as used herein may include "precursor", "gas mixture", "one or more further gasses", and "gas mixture comprising one or more further gasses".

In some embodiments, the term "substrate" can refer to any underlying material or materials that can be used to form a device, a circuit, or a film, or upon which a device, a circuit, or a film can be formed. A substrate can include a bulk material, such as silicon (e.g., single-crystal silicon, e.g. (100)Si), other Group IV materials, such as germanium, or other semiconductor materials, such as a Group II-VI or Group III-V semiconductor, and can include one or more layers overlying or underlying the bulk material.

It shall be understood that terms like "depositing" and the like as used herein can refer to a phase change from the gas phase to a solid phase change, through an intermediate flowable phase. Indeed, the meaning of the term "depositing" can include phase changes from a gaseous phase to a liquid phase, and can include processes in which gaseous reactants form liquid, liquid-like, or solidifying fluids. Thus, the meaning of the term "depositing" can encompass similar terms like condensing or forming.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

As used herein, the term "comprising" indicates that certain features are included, but that it does not exclude the presence of other features, as long as they do not render the claim unworkable. In some embodiments, the term "comprising" includes "consisting".

As used herein, the term "consisting" indicates that no further features are present in the apparatus/method/product apart from the ones following said wording. When the term "consisting" is used referring to a chemical compound, substance, or composition of matter, it indicates that the chemical compound, substance, or composition of matter only contains the components which are listed. This notwithstanding, the chemical compound, substance, or composition of matter may, in some embodiments, comprise other components as trace elements or impurities, apart from the components that are listed.

In some embodiments, the term "gap filling fluid", also referred to as "flowable gap fill", may refer to an oligomer which is liquid under the conditions under which is deposited on a substrate and which has the capability to cross link and form a solid film.

In some embodiments, the term "filling capability" may refer to a capability of filling a gap substantially without voids (e.g., no void having a size of approximately 5 nm or greater in diameter) and seams (e.g., no seam having a length of approximately 5 nm or greater), wherein seamless/void less bottom-up growth of a layer is observed. In some embodiments, the growth at a bottom of a gap may be at least approximately 1.5 times faster than growth on sidewalls of the gap and on a top surface having the gap. A film having filling capability can be referred to as "flowable film" or "viscous film". The flowable or viscous behavior of a film is often manifested as a concave surface at a bottom of a trench.

In this disclosure, a recess between adjacent protruding structures and any other recess pattern may be referred to as a "trench". That is, a trench may refer to any recess pattern including a hole/via. A trench can have, in some embodiments, a width of about 5 nm to about 150 nm, or about 30 nm to about 50 nm, or about 5 nm to about 10 nm, or about 10 nm to about 20 nm, or about 20 nm to about 30 nm, or about 50 nm to about 100 nm, or about 100 nm to about 150 nm. When a trench has a length that is substantially the same as its width, it can be referred to as a hole or a via. Holes or vias typically have a width of about 20 nm to about 100 nm. In some embodiments, a trench has a depth of about 30 nm to about 100 nm, and typically of about 40 nm to about 60 nm. In some embodiments, a trench has an aspect ratio of about 2 to about 10, and typically of about 2 to about 5. The dimensions of the trench may vary depending on process conditions, film composition, intended application, etc.

The following abbreviations are used herein: $^{t}$Bu stands for tert-butyl, $^{i}$Pr stands for isopropyl, Me stands for methyl, Et stands for ethyl, thd stands for 2,2,6,6-tetramethyl-3,5-heptanedionate, mmp stands for 1-methoxy-2-methyl-2-propoxide, hfac stands for hexafluoroacetylacetonate, Np stands for neopentyl, acac stands for acetylacetonate, AMD stands for acetamidinate, $^{t}Bu_2$DAD stands for 1,4-di-tert-butyl-1,3-diazadiene, py stands for 2,4-pentanedionate.

When specific process conditions are provided in this disclosure, they are provided for a reaction chamber volume of 1 liter and for 300 mm wafers. The skilled person understands that these values can be readily extended to other reaction chamber volumes and wafer sizes.

Described herein is a method for filling a gap. The method comprises introducing a substrate into a reaction chamber. Suitably, the substrate can comprise a semiconductor. The substrate is provided with a gap. The method further comprises introducing a reaction gas into the reaction chamber. The reaction gas comprises a noble gas, a first precursor and a second precursor. In some embodiments, the noble gas is selected from the group consisting of He, Ne, Ar, and Kr. In some embodiments, the noble gas comprises Ar.

The first precursor is different from the second precursor. In some embodiments, the first precursor and the second precursor have a molar mass of at least 50 g/mol. Additionally or alternatively, and in some embodiments, the first precursor and the second precursor can comprise one or more of an alkali metal, an alkaline earth metal, boron (B), aluminum (Al), carbon (C), and silicon (Si). Suitable alkali metals include Li, Na, K, Rb, and Cs. Suitable alkaline earth metals include Be, Mg, Ca, Sr, and Ba.

The method further comprises generating a plasma in the reaction chamber. Advantageously, the plasma can be generated in the reaction chamber while the first precursor and the second precursor are introduced into the reaction chamber. Thus, a gap filling fluid is formed that at least partially fills the gap. The gap filling fluid can be used during manufacturing processes of various semiconductor devices including, but not limited to, cell isolation in 3D cross point memory devices, self-aligned via, dummy gate, reverse tone patterning, PC RAM isolation, cut hard mask, and DRAM storage node contact (SNC) isolation.

In some embodiments, the method includes entirely filling the gap with a gap filling fluid. In some embodiments, the method includes filling the gap with gap filling fluid without the formation of voids or seams. In other words, in some embodiments, the deposition according to the present methods is continued until the gap is fully filled with a material having filling capability, and substantially no voids or seams are formed in the filled gap. The presence or absence of voids or seams can be observed, for example, by studying the formed material in a scanning tunneling electron microscope.

In some embodiments, no gasses other than the first precursor, the second precursor, and the noble gas are introduced into the reaction chamber while forming the gap filling fluid.

Advantageously, the composition of gap filing fluids can be controlled by changing the relative amounts of the first precursor and the second precursor that are provided to the reaction chamber. Thus, in some embodiments, the first precursor is provided to the reaction chamber at a flow rate which is from at least 0.01 times to at most 100 times at which the second precursor is provided to the reaction chamber.

It shall be understood that all flow rates and flow rate ratios as mentioned herein refer to volumetric flow rates and flow rate ratios under standard conditions.

In some embodiments, the gap has a depth of at least 5 nm to at most 500 nm, or of at least 10 nm to at most 250 nm, or from at least 20 nm to at most 200 nm, or from at least 50 nm to at most 150 nm, or from at least 100 nm to at most 150 nm.

In some embodiments, the gap has a width of at least 10 nm to at most 10 000 nm, or of at least 20 nm to at most 5 000 nm, or from at least 40 nm to at most 2 500 nm, or from at least 80 nm to at most 1000 nm, or from at least 100 nm to at most 500 nm, or from at least 150 nm to at most 400 nm, or from at least 200 nm to at most 300 nm.

In some embodiments, the gap has a length of at least 10 nm to at most 10 000 nm, or of at least 20 nm to at most 5 000 nm, or from at least 40 nm to at most 2 500 nm, or from at least 80 nm to at most 1000 nm, or from at least 100 nm to at most 500 nm, or from at least 150 nm to at most 400 nm, or from at least 200 nm to at most 300 nm.

In some embodiments, the gap filling fluid extends into a particular gap for a distance that equals from at least 1.0 to at most 10.0 times the width of the gap. In some embodiments, the gap filling fluid extends into a particular gap for a distance that equals from at least 1.5 to at most 9.0 times the width of the gap. In some embodiments, the gap filling fluid extends into a particular gap for a distance that equals from at least 2.0 to at most 8.0 times the width of the gap. In some embodiments, the gap filling fluid extends into a particular gap for a distance that equals from at least 3.0 to at most 6.0 times the width of the gap. In some embodiments, the gap filling fluid extends into a particular gap for a distance that equals from at least 4.0 to at most 6.0 times the width of the gap. In some embodiments, the gap filling fluid extends into a particular gap for a distance that equals about 5.0 times the width of the gap. In other words, and in some embodiments, the gap filling fluid fills the gap up to any one of the aforementioned distances from the bottom of the gap.

In some embodiments, the first precursor comprises a first element and the second precursor comprises a second element. The first element and the second element are different. Also, the first element and the second element are incorporated in the gap filling fluid.

In some embodiments, at least one of the first element and the second element is selected from Si, C, O, N, and B.

In some embodiments, at least one of the first precursor and the second precursor comprises a metal precursor. Thus, in some embodiments, the first precursor comprises a metal precursor. Additionally or alternatively, the second precursor can comprise a metal precursor. In some embodiments, the first precursor and the second precursor comprise a metal precursor. It shall be understood that the metal precursor comprises a metal. Thus, in some embodiments, at least one of the first element and the second element comprises a metal.

In some embodiments, at least one of the first element and the second element is a metal such as a transition metal, a post transition metal, or a rare earth metal.

In some embodiments, at least one of the first element and the second element is a transition metal. Suitable transition metals include Sc, Ti, V, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, and Hg. In some embodiments, the transition metal is selected from Ti, Zr, Hf, Ta, V, and Mo.

In some embodiments, at least one of the first element and the second metal is a post transition metal. Suitable post transition metals include Al, Ga, In, Sn, TI, Pb, and Bi.

In some embodiments, at least one of the first element and the second element is a rare earth metal. Suitable rare earth metal include lanthanides such as La, Ce, Pr, Nd, Pm, Sm, Eu, Gd, Tb, Dy, Ho, Er, Tm, and Yb.

Thus, in some embodiments, the first precursor comprises Ti and the second precursor comprises Si and C. Accordingly, gap filling fluids comprising Ti, Si, and C can be formed.

In some embodiments, the first precursor comprises Ti and the second precursor comprises Si, O, and C. Accordingly, gap filling fluids comprising Ti, Si, O, and C can be formed.

In some embodiments, the first precursor comprises Ta and the second precursor comprises Si and C. Accordingly, gap filling fluids comprising Ta, Si, and C can be formed.

In some embodiments, the first precursor comprises Ta and the second precursor comprises Si, O, and C. Accordingly, gap filling fluids comprising Ta, Si, O, and C can be formed.

In some embodiments, the metal precursor is selected from the list consisting of: metal halides, metal alkyls, metal alkenyls, metal aryls, metal beta-diketonates, metal alkoxides, and metal aryloxides.

In some embodiments, the metal precursor is a homoleptic precursor.

In some embodiments, the metal precursor is a heteroleptic precursor. For example, the precursor can comprise two different alkyl ligands, or two different aromatic ligands, or two different beta-diketonate ligands, or two different alkoxide ligands, or two different aryloxide ligands. In some embodiments, the metal precursor comprises a first ligand and a second ligand, wherein the first ligand and the second ligand respectively contain a first functional group and a second functional group, wherein the first functional group and the second functional group are different.

In some embodiments, the first precursor comprises a metal alkyl, such as a homoleptic metal alkyl. Examples of metal alkyls include methyls, ethyls, propyls, butyls, and pentyls. An exemplary butyl is isobutyl.

In some embodiments, the first precursor comprises a metal alkyamine, such as a homoleptic metal alkylamine. Examples of metal alkylamines include methylamines, ethylamines, propylamines, and butylamines. An exemplary metal alylamine is tetrakis(dimethylamino)titanium.

In some embodiments, the second precursor comprises an alkyl-substituted benzene, such as a benzene with 1, 2, 3, 4, 5, or 6 alkyl substituents. Suitable alkyl substituents include methyl, ethyl, propyl, butyl, and pentyl. An exemplary alkyl-substituted benzene is toluene.

In some embodiments, the first precursor comprises a metal alkylamine such as tetrakis(dimethylamino)titanium, tetrakis(dimethylamino)hafnium, and tetrakis(dimethylamino)zirconium; and the second precursor comprises an alkyl-substituted benzene such as toluene.

In some embodiments, the first precursor comprises a metal precursor—e.g. a metal alkylamine, such as tetrakis (dimethylamino)titanium, or a metal halide, such as $TiCl_4$—; and the second precursor comprises a silazane, such as bis(disilylamino)silane.

In some embodiments, the first or second precursor comprises a tantalum precursor. Suitable tantalum precursors include tantalum alkylamines such as tantalum alkylamines comprising at least two different alkylamine ligands. In other words, and in some embodiments, the tantalum precursor is a heteroleptic alkylamine. Suitable tantalum alkylamines include Tris(diethylamido)(tert-butylimido)tantalum(V). Such tantalum alkylamines can be especially suitable when combined with a second precursor that comprises an alkyl-substituted aromatic hydrocarbon such as toluene. Accordingly, a gap filling fluid comprising Ta, N, and C can be formed.

In some embodiments, the first or second precursor comprises a siloxane. In some embodiments, the siloxane comprises one or more alkyl substituents. In some embodiments, the siloxane comprises one or more alkoxy substituents. In some embodiments, the siloxane comprises one or more alkyl and one or more alkoxy substituents. In some embodiments, the siloxane comprises 1,1,3,3-tetramethyl-1,3-dimethoxydisiloxane or an isomer thereof. Such siloxanes can be especially suitable when combined with a second precursor that comprises an alkyl-substituted aromatic hydrocarbon such as toluene. Accordingly, a gap filling fluid comprising Si, O, and C can be formed.

In some embodiments, the first or second precursor comprises an alkylamine-substituted halogenated alkane or alkene, such as an alkylamine-substituted fluorinated alkane or alkene. Examples of alkylamine-substituted alkanes include N,N-diethyl-(1,1,2,3,3,3-hexafluoropropyl)amine.
Examples of alkylamine-substituted alkenes include N,N-diethyl-(E)-pentafluoropropenylarnine. Such precursors can be suitably combined with a tantalum precursor as described herein. Accordingly, a gap filling fluid comprising N, C, and Ta can be suitably formed.

In some embodiments, the first or second precursor comprises a lithium precursor. Suitable lithium precursors include alkoxides such as $Li(O^tBu)$, beta diketonates such as Li(thd), and alkylsilylamines such as $LiN(SiMe_3)_2$, alkylsilanolates such as $LiOSiMe_3$, and alkylsilazides such as $LiN(SiMe_3)_2$.

In some embodiments, the first or second precursor comprises a beryllium precursor. Suitable beryllium precursors include alkyls such as $Be(Me)_2$ and $Be(Et)_2$.

In some embodiments, the first or second precursor comprises a boron precursor. Suitable boron precursors include alkylamines such as $B(NMe_2)_3$ and $B(NEtMe)_3$, alkoxides such as $B(OMe)_3$, and halides such as $BCl_3$ and $BBr_3$.

In some embodiments, the first or second precursor comprises a carbon precursor. Suitable carbon precursors include halides such as $CBr_4$ and $CCl_3$.

In some embodiments, the first or second precursor comprises a sodium precursor. Suitable sodium precursors include alkoxides such as $Na(O^tBu)$, alkylsilanolates such as $NaOSiMe_3$, and beta-diketonates such as Na(thd).

In some embodiments, the first or second precursor comprises a magnesium precursor. Suitable magnesium precursors include alkyl-substituted cyclodienyls such as $Mg(EtCp)_2$, beta-diketonates such as $Mg(thd)_2$, and unsubstituted cyclodienyls such as $MgCp_2$.

In some embodiments, the first or second precursor comprises an aluminum precursor. Suitable aluminum precursors include halides such as $AlCl_3$, alkyls such as $AlMe_3$, alkoxides such as $Al(O^iPr)_3$, amidinates such as $Al(^iPrAMD)Et_2$, alkylamines such as $Al(NEt_2)_2(C_3H_6NMe_2)$ and $Al(NEt_2)_3$, alkoxides such as 1-methoxy-2-methyl-2-propoxide, and heteroleptic precursors such as $AlMe_2Cl$.

In some embodiments, the first or second precursor comprises a silicon precursor. Suitable silicon precursors include halosilanes such as $Si_2Cl_6$, higher order silanes such as disilane and trisilane, silylamines such as $N(Si_2H_5)_3$, and heteroleptic precursors such as $SiCl_2Me_2$.

In some embodiments, the first or second precursor comprises a phosphorous precursor. Suitable phosphorous precursors include halides such as $PCl_3$ and oxyhalides such as $POCl_3$.

In some embodiments, the first or second precursor comprises a potassium precursor. Suitable potassium precursors include alkoxides such as KOtBu.

In some embodiments, the first or second precursor comprises a calcium precursor. Suitable calcium precursors include beta-diketonates such as $Ca(hfac)_2$ and $Ca(thd)_2$, and alkyl-substituted cyclodienes such as $Ca(iPr_3Cp)_2$.

In some embodiments, the first or second precursor comprises a scandium precursor. Suitable scandium precursors include substituted or unsubstituted cyclodienes such as $Sc(iPrCp)_3$ and $ScCp_3$, and heteroleptic precursors such as $Sc(MeCp)_2(Me_2pz)$.

In some embodiments, the first or second precursor comprises a titanium precursor. Suitable titanium precursor include halides such as $TiCl_4$, alkyls such as $Ti(Np)_4$, and alkylamines such as $Ti(Et_2)_4$.

In some embodiments, the first or second precursor comprises a vanadium precursor. Suitable vanadium precursors included betadicetonates such as $VO(acac)_2$, alkylamines such as $V(NEt_2)_4$, amidinates such as $V(^iPrAMD)_3$, alkoxides such as $VO(O^iPr)_3$, and halides such as $VCl_4$.

In some embodiments, the first or second precursor comprises a chromium precursor. Suitable chromium precursors include beta-diketonates such as $Cr(acac)_3$ and halides such as $CrO_2Cl_2$.

In some embodiments, the first or second precursor comprises a manganese precursor. Suitable manganese precursors include alkyl-substituted cyclodienyls such as $Mn(EtCp)_2$ and $Mn(MeCp)_2$, amidinates such as $Mn(^tBuAMD)_2$, and beta-diketonates such as $Mn(thd)_3$.

In some embodiments, the first or second precursor comprises an iron precursor. Suitable iron precursors include amidinates such as $Fe(^tBuAMD)_2$, beta-diketonates such as $Fe(acac)_3$, and cyclodienyls such as $Fe(Cp)_2$.

In some embodiments, the first or second precursor comprises a cobalt precursor. Suitable cobalt precursors include diazadienes such as such as $Co(^tBu_2DAD)_2$, alkyl-substituted cyclodienes such as $Co(CpEt)_2$, and carbonyls such as $Co_2(CO)_8$.

In some embodiments, the first or second precursor comprises a nickel precursor. Suitable nickel precursors include beta-diketonates such as $Ni(acac)_2$, cyclodienyls such as $Ni(Cp)_2$, and heteroleptic precursors such as $Ni(acac)_2(py)_2$.

In some embodiments, the first or second precursor comprises a copper precursor. Suitable copper precursors include beta-diketonates such as $Cu(acac)_2$ and amidinates such as $[Cu(iPrAMD)]_2$.

In some embodiments, the first or second precursor comprises a zinc precursor. Suitable zinc precursors include alkyls such as $ZnEt_2$ and halides such as $ZnCl_2$.

In some embodiments, the first or second precursor comprises a gallium precursor. Suitable gallium precursors include beta-diketonates such as $Ga(acac)_3$, alkyl-substituted cyclodienyls such as $Ga(CpMe_5)$, and alkyls such as $GaMe_3$ and $GaEt_3$.

In some embodiments, the first or second precursor comprises a germanium precursor. Suitable germanium precursors include germanes such as digermane, halogermanes such as tetrachlorogermane, and alkylgermanes such as diethylgermane.

In some embodiments, the first or second precursor comprises a rubidium precursor. Suitable rubidium precursors include alkoxides such as RbOtBu.

In some embodiments, the first or second precursor comprises a strontium precursor. Suitable strontium precursors include alkyl-substituted cyclodienyls such as $Sr(Cp^{i}Pr_3)_2$.

In some embodiments, the first or second precursor comprises an yttrium precursor. Suitable yttrium precursors include alkyl-substituted cyclodienyls such as $Y(Cp^{i}Pr_3)_2$ and heteroleptic precursors such as $Y(EtCp)_2(^{i}Pr_2AMD)$.

In some embodiments, the first or second precursor comprises a zirconium precursor. Suitable zirconium precursors include alkylamines such as $Zr(NEtMe)_4$ and alkoxides such as $Zr(O^{t}Bu)_4$.

In some embodiments, the first or second precursor comprises a niobium precursor. Suitable niobium precursors include heteroleptic precursors such as $Nb(N^{t}Bu)(NEt_2)_2(Cp)$, alkoxides such as $Nb(OEt)_5$, and halides such as $NbCl_5$.

In some embodiments, the first or second precursor comprises a molybdenum precursor. Suitable molybdenum precursors include halides such as $MoCl_5$, carbonyls such as $Mo(CO)_6$, and heteroleptic precursors such as $MoCp(CO)_2(NO)$.

In some embodiments, the first or second precursor comprises a ruthenium precursor. Suitable ruthenium precursors include alkyl-substituted cyclodienyls such as $Ru(CpEt)_2$ and $Ru(CpEtMe)_2$.

In some embodiments, the first or second precursor comprises a rhodium precursor. Suitable rhodium precursors include beta-diketonates such as $Rh(acac)_3$.

In some embodiments, the first or second precursor comprises a palladium precursor. Suitable palladium precursors include beta-diketonates such as $Pd(hfac)_2$.

In some embodiments, the first or second precursor comprises a silver precursor. Suitable silver precursors include heteroleptic precursors such as $Ag(hfac)(PMe_3)$.

In some embodiments, the first or second precursor comprises a cadmium precursor. Suitable cadmium precursors include alkyls such as $CdMe_2$.

In some embodiments, the first or second precursor comprises an indium precursor. Suitable indium precursors include beta-diketonates such as $In(acac)_3$.

In some embodiments, the first or second precursor comprises a tin precursor. Suitable tin precursors include halides such as $SnCl_4$.

In some embodiments, the first or second precursor comprises a cesium precursor. Suitable cesium precursors include alkoxides such as $CsO^{t}Bu$.

In some embodiments, the first or second precursor comprises a barium precursor. Suitable barium precursors include alkyl-substituted cyclodienyls such as $Ba(CpMe_5)_2$.

In some embodiments, the first or second precursor comprises a lanthanum precursor. Suitable lanthanum precursors include alkyl-substituted or unsubstituted cyclodienyls such as $La(Cp)_3$ and $La(CpEt)_3$.

In some embodiments, the first or second precursor comprises a cerium precursor. Suitable cerium precursors include beta-diketonates such as $Ce(thd)_4$ and alkyl-substituted cyclodienyls such as $Ce(^{i}PrCp)_3$.

In some embodiments, the first or second precursor comprises a praseodymium precursor. Suitable praseodymium precursors include alkyl-substituted cyclodienyls such as $Pr(Cp^{i}Pr)_3$.

In some embodiments, the first or second precursor comprises a neodymium precursor. Suitable neodymium precursors include beta-diketonates such as $Nd(thd)_3$.

In some embodiments, the first or second precursor comprises a samarium precursor. Suitable samarium precursors include beta-diketonates such as $Sm(thd)_3$.

In some embodiments, the first or second precursor comprises a europium precursor. Suitable europium precursors include beta-diketonates such as $Eu(thd)_3$.

In some embodiments, the first or second precursor comprises a gadolinium precursor. Suitable gadolinium precursors include alkyl-substituted cyclodienyls such as $Gd(CpMe)_3$.

In some embodiments, the first or second precursor comprises a terbium precursor. Suitable terbium precursors include beta-diketonates such as $Tb(thd)_3$.

In some embodiments, the first or second precursor comprises a dysprosium precursor. Suitable dysprosium precursors include beta-diketonates such as $Dy(thd)_3$.

In some embodiments, the first or second precursor comprises a holmium precursor. Suitable holmium precursors include beta-diketonates such as $Ho(thd)_3$.

In some embodiments, the first or second precursor comprises an erbium precursor. Suitable erbium precursors include beta-diketonates such as $Er(thd)_3$.

In some embodiments, the first or second precursor comprises a thulium precursor. Suitable thulium precursors include cyclodienyls such as $TmCp_3$.

In some embodiments, the first or second precursor comprises an ytterbium precursor. Suitable ytterbium precursors include alkyl-substituted cyclodienyls such as $Yb(MeCp)_3$.

In some embodiments, the first or second precursor comprises a lutetium precursor. Suitable lutetium precursors include alkoxides such as $Lu(O^{i}Pr)_3$.

In some embodiments, the first or second precursor comprises a hafnium precursor. Suitable hafnium precursors include alkylamines such as $Hf(NEtMe)_4$.

In some embodiments, the first or second precursor comprises a tantalum precursor. Suitable tantalum precursors include halides such as $TaCl_5$.

In some embodiments, the first or second precursor comprises a tungsten precursor. Suitable tungsten precursors include halides such as $WCl_6$.

In some embodiments, the first or second precursor comprises a rhenium precursor. Suitable rhenium precursors include halides such as $ReCl_5$.

In some embodiments, the first or second precursor comprises an osmium precursor. Suitable osmium precursors include cyclodienyls such as $OsCp_2$.

In some embodiments, the first or second precursor comprises an iridium precursor. Suitable iridium precursors include beta-diketonates such as $Ir(acac)_3$.

In some embodiments, the first or second precursor comprises a platinum precursor. Suitable platinum precursors include beta-diketonates such as $Pt(acac)_2$.

In some embodiments, the first or second precursor comprises a gold precursor. Suitable gold precursors include heteroleptic precursors such as $Au(PMe_3)Me_3$.

In some embodiments, the first or second precursor comprises a mercury precursor. Suitable mercury precursors include alkyls such as $HgMe_2$.

In some embodiments, the first or second precursor comprises a thallium precursor. Suitable thallium precursors include beta-diketonates such as TI(acac).

In some embodiments, the first or second precursor comprises a lead precursor. Suitable lead precursors include precursors having an aromatic ligand such as $PbPh_4$.

In some embodiments, the first or second precursor comprises a bismuth precursor. Suitable bismuth precursors include halides such as $BiCl_3$.

In some embodiments, the reaction gas further comprises a third precursor. It shall be understood that the third precursor is different from the first precursor and from the second precursor. The third precursor comprises a third element. The third element is different from the first element and from the second element. When the reaction gas further comprises a third precursor, the third element can, in some embodiments, be incorporated in the gap filling fluid.

In some embodiments, the third precursor is selected from any one of the precursors listed as a possible first precursor or second precursor.

In some embodiments, the third element selected from Si, C, O, N, and B.

In some embodiments, the third element is a metal such as a transition metal, a post transition metal, or a rare earth metal.

In some embodiments, the third element is a transition metal. Suitable transition metals include Sc, Ti, V, Cr, Mn, Fe, Co, Ni, Cu, Zn, Y, Zr, Nb, Mo, Tc, Ru, Rh, P, Ag, Cd, Lu, Hf, Ta, W, Re, Os, Ir, Pt, Au, and Hg.

In some embodiments, the third element is a post transition metal. Suitable post transition metals include Al, Ga, In, Sn, TI, Pb, and Bi.

In some embodiments, the third element is a rare earth metal. Suitable rare earth metal include lanthanides such as La, Ce, Pr, Nd, Pm, Sm, Eu, Gd, Tb, Dy, Ho, Er, Tm, and Yb.

In some embodiments, the third precursor comprises ammonia. In some embodiments, the first precursor comprises a silazane such as a silazane having the formula

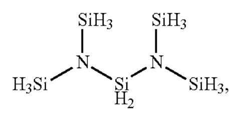

the second precursor comprises an alkyl-substituted benzene such as toluene, and the third precursor comprises ammonia.

In some embodiments, the reaction gas further comprises a fourth, fifth, or further precursor. For example, the reaction gas can contain multiple metal precursors. It shall be understood that the fourth, fifth, or further precursors are different from one another, and that they are different from the first precursor, the second precursor, and the third precursor. In some embodiments, the fourth, fifth, or further precursor is selected from any one of the precursors listed herein as possible first or second precursors.

In some embodiments, the first precursor comprises a carbon precursor, such as an alkyl-substituted benzene, such as toluene; the second precursor comprises a titanium precursor such as tetrakis(dimethylamido)titanium, and the third precursor comprises a tantalum precursor such as tris(diethylamido)(tert-butylimido)tantalum.

In some embodiments, at least one of the first precursor and the second precursor is selected from the list consisting of hydrocarbons, amines, amides, imides, silanes, alkylsilanes, siloxanes, and borazanes.

In some embodiments, at least one of the first precursor and the second precursor comprises a silicon precursor. In some embodiments, the silicon precursor comprises silicon and a halogen. In some embodiments, the silicon precursor has a general formula of $Si_nH_{2n+2-m}X_m$, wherein X is a halogen, n is from at least 1 to at most 3, and m is from at least 1 to at most 2n+2. In some embodiments, the halogen is selected from F, Cl, Br, and I. In other words, and in some embodiments, the silicon precursor is a halogenated silane. In some embodiments, the silicon precursor has a general formula of $Si_nH_{2n+2-m}I_m$, wherein n is from at least 1 to at most 3, and m is from at least 1 to at most 2n+2.5. In some embodiments, the silicon precursor comprises $SiI_2H_2$. In some embodiments, the silicon precursor consists of $SiI_2H_2$. In some embodiments, the silicon precursor comprises or substantially consists of silicon, hydrogen, and one or more halogens. It shall be understood that, when the silicon precursor consists of certain components, other components may, in some embodiments, still be present in small quantities, e.g. as contaminants.

In some embodiments, at least one of the first precursor and the second precursor comprises a carbon precursor. In some embodiments, the carbon precursor comprises carbon and hydrogen. Suitable carbon precursors include substituted or unsubstituted aromatic hydrocarbons, for example alkylbenzenes such as toluene and 1,2,4-trimethylbenzene.

In some embodiments, at least one of the first precursor and the second precursor comprises a silazane, such as trisilylamine or bis(disilylamino)silane. In some embodiments, at least one of the first precursor and the second precursor comprises an alkyl-substituted silazane such as bis(diethylamino)silane.

In some embodiments, at least one of the first precursor and the second precursor comprises a halosilane such as a fluorosilane, a chlorosilane, a bromosilane, or an iodosilane. In some embodiments, the halosilane comprises hexachlorodisilane. Accordingly, a gap filling fluid comprising Si can be formed.

In some embodiments, at least one of the first precursor and the second precursor comprises an alkylsilyl posphite such as trimethylsilyl phosphite. Accordingly, a gap filling fluid comprising Si, O, C, and P can be formed.

In some embodiments, at least one of the first precursor and the second precursor comprises an alkylsilyl borate such as trimethylsilyl borate. Accordingly, a gap filling fluid comprising Si, O, C, and B can be formed.

In some embodiments, at least one of the first precursor and the second precursor comprises a silane such as trisilane. Accordingly, a gap filling fluid comprising Si can be formed.

In some embodiments, at least one of the first precursor and the second precursor comprises borazine. Accordingly, a gap filling fluid comprising B, N, and H can be formed.

In some embodiments, at least one of the first precursor and the second precursor comprises a silazane such as a compound having the following formula:

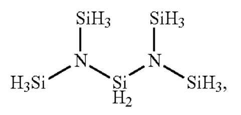

Accordingly, a gap filling fluid comprising Si and N can be formed.

In some embodiments, at least one of the first precursor and the second precursor comprises an alkyl-substituted benzene such as toluene. Accordingly, a gap filing fluid comprising C can be formed.

In some embodiments, at least one of the first precursor and the second precursor comprises a cyclic diene such as cyclopentadiene. Accordingly, a gap filling fluid comprising C can be formed.

In some embodiments, at least one of the first precursor and the second precursor comprises an alkyl-substituted cyclic silazane such as hexamethylcyclotrisilazane. Accordingly, a gap filling fluid comprising Si, C, and N can be formed.

In some embodiments, at least one of the first precursor and the second precursor comprises an alkyl-substituted linear silazane such as hexamethyldisilazane. Accordingly, a gap filling fluid comprising Si, C, and N can be formed.

In some embodiments, at least one of the first precursor and the second precursor comprises an alkyl- and alkylsilyl-substituted hydrazine such as 1,1-bis(dimethylsilyl)-2,2-dimethylhydrazine. Accordingly, a gap filling fluid comprising Si, C, and N can be formed.

In some embodiments, at least one of the first precursor and the second precursor comprises an alkyl-substituted silane such as trimethylsilane. Accordingly, a gap filling fluid comprising Si and C can be formed.

In some embodiments, at least one of the first precursor and the second precursor comprises an alkyl- and alkenyl-substituted silane such as dimethylydivinysilane. Accordingly, a gap filling fluid comprising Si and C can be formed.

In some embodiments, at least one of the first precursor and the second precursor comprises an alkyl-substituted silane such as hexamethyldisilane. Accordingly, a gap filling fluid comprising Si and C can be formed.

In some embodiments, at least one of the first precursor and the second precursor comprises a halosilane such as diiodosilane or hexachlorodisilane. Accordingly, a gap filling fluid comprising Si can be formed.

In some embodiments, at least one of the first precursor and the second precursor comprises borazine. Accordingly, a gap filling fluid comprising B and N can be formed.

In some embodiments, at least one of the first precursor and the second precursor comprises a Si and N containing compound such as trisilylamine, N,N,N',N'-tetrasilyl-silanediamine, or $(SiH_3)_2$—N—$SiH_2$—NH—$SiH_2$—N—$(SiH_3)_2$. Accordingly, a gap filling fluid comprising Si and N can be formed.

In some embodiments, at least one of the first precursor and the second precursor comprises an alkylamine- and alkyl-substituted cyclosiloxane such as 2-diethylamino-2,4,6,8-tetramethylcyclotetrasiloxane. Accordingly, a gap filling fluid comprising Si, O, C, and N can be formed.

In some embodiments, at least one of the first precursor and the second precursor comprises an alkyl-substituted cyclosiloxane such as octamethylcyclotetrasiloxane, 2,4,6,8-tetramethylcyclotetrasiloxane, or decamethylcyclopentasiloxane. Accordingly, a gap filling fluid comprising Si, O, and C can be formed.

In some embodiments, at least one of the first precursor and the second precursor comprises a tertiary amine comprising one or more alkyl chains and one or more haloalkyl chains. Examples of such compounds include N,N-diethyl-(1,1,2,3,3,3-hexafluoropropyl)amine and N,N-diethyl-(E)-pentafluoropropenylamine. Accordingly, gap filling fluids comprising C, N, and a halogen such as F can be formed.

In some embodiments, at least one of the first precursor and the second precursor comprises an alkyl-, alkoxy- and alkenyl-substituted silane such as dimethoxymethylvinylsilane. Accordingly, a gap filling fluid comprising Si, O, and C can be formed.

In some embodiments, at least one of the first precursor and the second precursor comprises an unsaturated cyclic hydrocarbon such as cyclopentadiene. Accordingly, a gap filling fluid comprising C can be formed.

In some embodiments, at least one of the first precursor and the second precursor comprises an unsaturated aliphatic hydrocarbon such as ethene. Accordingly, a gap filling fluid comprising C can be formed.

In some embodiments, at least one of the first precursor and the second precursor comprises a halogentated borazine such as hexachloroborazine. Accordingly, a gap filling fluid comprising B and N can be formed.

In some embodiments, at least one of the first precursor and the second precursor comprises a linear or cyclic higher order silane such as trisilane, neopentasilane, tetrasilane, neopentasilane, or cyclohexasilane. Accordingly, a gap filling fluid comprising Si can be formed.

In some embodiments, at least one of the first precursor and the second precursor comprises a linear or cyclic siloxane such as dodecamethylhexasiloxane. Accordingly, a gap filling fluid comprising Si, O, and C can be formed.

In some embodiments, at least one of the first precursor and the second precursor comprises a cyclic or linear silazane such as hexamethyldisilazane. Accordingly, a gap filling fluid comprising Si, N, and C can be formed.

In some embodiments, at least one of the first precursor and the second precursor comprises an organosilicon compound comprising one or more alkyl substituents, and optionally comprising one or more unsaturated bonds such as 1,1-methylvinyldisilane. Accordingly, a gap filling fluid comprising Si and C can be formed.

In some embodiments, at least one of the first precursor and the second precursor comprises carbon (C). In some embodiments, at least one of the first precursor and the second precursor comprises silicon (Si). In some embodiments, at least one of the first precursor and the second precursor comprises Si and C. In some embodiments, at least one of the first precursor and the second precursor comprises Si, C, and oxygen (O). In some embodiments, at least one of the first precursor and the second precursor comprises Si, C, and nitrogen (N). In some embodiments, at least one of the first precursor and the second precursor comprises Si and N. In some embodiments, at least one of the first precursor and the second precursor comprises N and boron (B). In some embodiments, at least one of the first precursor and the second precursor comprises C, O, and N.

Advantageously, employing a first precursor that comprises B, N, and H; and a second precursor that comprises C, O, N, and H can allow forming gap filling fluids that comprise B, N, C, O, and H. The present methods can be particularly advantageous for controlling the composition of such gap filling fluids.

Advantageously, employing a first precursor that comprises Si and H; and a second precursor that comprises C, O, N, and H can allow forming gap filling fluids that comprise Si, C, O, N, and H. The present methods can be particularly advantageous for controlling the composition of such gap filling fluids.

Advantageously, employing a first precursor that comprises Si and H; and a second precursor that comprises B, N, and H can allow forming gap filling fluids that comprise Si, B, N, and H. The present methods can be particularly advantageous for controlling the composition of such gap filling fluids.

Advantageously, employing a first precursor that comprises Si, N, and H; and a second precursor that comprises C, O, N, and H can allow forming gap filling fluids that comprise Si, N, C, O, and H. The present methods can be particularly advantageous for controlling the composition of such gap filling fluids.

Advantageously, employing a first precursor that comprises Si, N, and H; and a second precursor that comprises B, N, and H can allow forming gap filling fluids that comprise Si, B, N, and H. The present methods can be particularly advantageous for controlling the composition of such gap filling fluids.

Advantageously, employing a first precursor that comprises Si, N, and H; and a second precursor that comprises Si and H can allow forming gap filling fluids that comprise Si, N, and H. The present methods can be particularly advantageous for controlling the composition of such gap filling fluids.

Advantageously, employing a first precursor that comprises Si, C, N, and H; and a second precursor that comprises C, O, N, and H can allow forming gap filling fluids that comprise Si, C, N, O, and H. The present methods can be particularly advantageous for controlling the composition of such gap filling fluids.

Advantageously, employing a first precursor that comprises Si, C, N, and H; and a second precursor that comprises B, N, and H can allow forming gap filling fluids that comprise Si, C, B, N, and H. The present methods can be particularly advantageous for controlling the composition of such gap filling fluids.

Advantageously, employing a first precursor that comprises Si, C, N, and H; and a second precursor that comprises Si and H can allow forming gap filling fluids that comprise Si, C, N, and H. The present methods can be particularly advantageous for controlling the composition of such gap filling fluids.

Advantageously, employing a first precursor that comprises Si, C, N, and H; and a second precursor that comprises Si, N, and H can allow forming gap filling fluids that comprise Si, C, N, and H. The present methods can be particularly advantageous for controlling the composition of such gap filling fluids.

Advantageously, employing a first precursor that comprises Si, C, O, and H; and a second precursor that comprises C, O, and N can allow forming gap filling fluids that comprise Si, C, O, N, and H. The present methods can be particularly advantageous for controlling the composition of such gap filling fluids.

Advantageously, employing a first precursor that comprises Si, C, O, and H; and a second precursor that comprises B, N, and H can allow forming gap filling fluids that comprise Si, C, O, B, N, and H. The present methods can be particularly advantageous for controlling the composition of such gap filling fluids.

Advantageously, employing a first precursor that comprises Si, C, O, and H; and a second precursor that comprises Si and H can allow forming gap filling fluids that comprise Si, C, O, and H. The present methods can be particularly advantageous for controlling the composition of such gap filling fluids.

Advantageously, employing a first precursor that comprises Si, C, O, and H; and a second precursor that comprises Si and N can allow forming gap filling fluids that comprise Si, C, O, N, and H. The present methods can be particularly advantageous for controlling the composition of such gap filling fluids.

Advantageously, employing a first precursor that comprises Si, C, O, and H; and a second precursor that comprises Si, C, N, and H can allow forming gap filling fluids that comprise Si, C, O, N, and H. The present methods can be particularly advantageous for controlling the composition of such gap filling fluids.

Advantageously, employing a first precursor that comprises C, and H; and a second precursor that comprises C, O, N, and H can allow forming gap filling fluids that comprise C, O, N, and H. The present methods can be particularly advantageous for controlling the composition of such gap filling fluids.

Advantageously, employing a first precursor that comprises C, and H; and a second precursor that comprises B, N, and H can allow forming gap filling fluids that comprise B, C, and N. The present methods can be particularly advantageous for controlling the composition of such gap filling fluids.

Advantageously, employing a first precursor that comprises C, and H; and a second precursor that comprises Si and H can allow forming gap filling fluids that comprise Si, C, and H. The present methods can be particularly advantageous for controlling the composition of such gap filling fluids.

Advantageously, employing a first precursor that comprises C, and H; and a second precursor that comprises Si, N, and H can allow forming gap filling fluids that comprise Si, C, N, and H. The present methods can be particularly advantageous for controlling the composition of such gap filling fluids.

Advantageously, employing a first precursor that comprises C, and H; and a second precursor that comprises Si, C, N, and H can allow forming gap filling fluids that comprise Si, C, N, and H. The present methods can be particularly advantageous for controlling the composition of such gap filling fluids.

Advantageously, employing a first precursor that comprises C, and H; and a second precursor that comprises Si, C, O, and H can allow forming gap filling fluids that comprise Si, C, O, and H. The present methods can be particularly advantageous for controlling the composition of such gap filling fluids.

Advantageously, employing a first precursor that comprises Si, C, and H; and a second precursor that comprises C, O, and N can allow forming gap filling fluids that comprise Si, C, O, N, and H. The present methods can be particularly advantageous for controlling the composition of such gap filling fluids.

Advantageously, employing a first precursor that comprises Si, C, and H; and a second precursor that comprises B, N, and H can allow forming gap filling fluids that comprise Si, B, N, C, and H. The present methods can be particularly advantageous for controlling the composition of such gap filling fluids.

Advantageously, employing a first precursor that comprises Si, C, and H; and a second precursor that comprises Si and H can allow forming gap filling fluids that comprise Si, C, and H. The present methods can be particularly advantageous for controlling the composition of such gap filling fluids.

Advantageously, employing a first precursor that comprises Si, C, and H; and a second precursor that comprises Si, N, and H can allow forming gap filling fluids that comprise Si, C, N, and H. The present methods can be particularly advantageous for controlling the composition of such gap filling fluids.

Advantageously, employing a first precursor that comprises Si, C, and H; and a second precursor that comprises Si, N, C, and H can allow forming gap filling fluids that comprise Si, N, C, and H. The present methods can be particularly advantageous for controlling the composition of such gap filling fluids.

Advantageously, employing a first precursor that comprises Si, C, and H; and a second precursor that comprises Si, C, O, and H can allow forming gap filling fluids that comprise Si, C, O, and H. The present methods can be particularly advantageous for controlling the composition of such gap filling fluids.

Advantageously, employing a first precursor that comprises Si, C, and H; and a second precursor that comprises C, and H can allow forming gap filling fluids that comprise Si, C, and H. The present methods can be particularly advantageous for controlling the composition of such gap filling fluids.

In some embodiments, at least one of the first precursor and the second precursor is supplied to the reaction chamber by means of a carrier gas, i.e. as a gas that entrains the precursor, and/or as an additional gas. In some embodiments, the carrier gas is provided at a flow rate of at least 0.2 to at most 2.0 slpm, or from at least 0.3 to at most 1.5 slpm, or from at least 0.4 to at most 1.0 slpm, or from at least 0.5 to at most 0.7 slpm. These exemplary carrier gas flow rates are provided for the case when the substrate is a 300 mm wafer. Flow rates for other wafer sizes can be trivially derived from these flow rates. Suitable carrier gasses include noble gasses such as He, Ne, Ar, and Kr. It shall be understood that a carrier gas refers to a gas that carries, or entrains, a precursor to the reaction chamber. An exemplary carrier gas includes a noble gas such as argon.

In some embodiments, the reaction gas further comprises $H_2$. It shall be understood that a noble gas such as argon is not substantially incorporated in the gap filling fluid. This notwithstanding, when the reaction gas comprises $H_2$, hydrogen may be incorporated in the gap filling fluid.

In some embodiments, the present methods comprise providing at least one of the first, second, or third precursor intermittently to the reaction space, and continuously applying a plasma. Thus, in some embodiments, a continuous plasma is used instead of plasma pulses. In some embodiments, the present methods involve providing at least one of the first, second, or third precursor intermittently to the reaction space, and intermittently generating a plasma.

In some embodiments, at least one of the first, second, and third precursor is continuously provided to the reaction chamber whereas a plasma is generated intermittently.

In some embodiments, the present methods comprise continuously providing at least one of the first, second, and third precursor to the reaction chamber, and continuously generating a plasma in the reaction chamber, e.g. through application of RF power, while forming the gap filling fluid.

In some embodiments, the plasma is generated intermittently. In some embodiments, a pulsed plasma, e.g. a pulsed RF plasma is generated in the reaction chamber. Thus, the method comprises a plurality of cycles, a cycle comprising a plasma on pulse and a plasma off pulse. In some embodiments, a plasma on pulse lasts from at least 0.7 seconds to at most 2.0 seconds, for example from at least 0.7 seconds to at most 1.5 seconds. In some embodiments, a plasma off pulse lasts from at least 0.7 seconds to at most 2.0 seconds, for example from at least 0.7 seconds to at most 1.5 seconds.

In some embodiments, the plasma is generated continuously.

In some embodiments, at least one of the first precursor and the second precursor is intermittently provided to the reaction chamber.

In some embodiments, at least one of the first precursor and the second precursor is continuously provided to the reaction chamber.

Advantageously, the elemental composition and the physical properties of a gap filling fluid formed by means of an embodiment of a method as described herein can be controlled by controlling pulse times, inter-pulse interval durations, precursor flow rates, plasma parameters, source temperatures, carrier gas flow rates, and the like.

In some embodiments, forming the gap filling fluid comprises executing a cyclical deposition process. The cyclical deposition process comprises executing a plurality of deposition cycles. A deposition cycle can comprise a precursor pulse and a plasma pulse. The precursor pulse comprises introducing at least one of the first, second, and third precursor into the reaction chamber. The plasma pulse comprises generating a plasma in the reaction chamber Thus, a gap filling fluid can be formed that fills the gap at least to some extent. If desired, the deposition cycle can be repeated one or more times until a suitable amount of gap filling fluid has been formed in the gap.

In some embodiments, a method as described herein comprises from at least 10 to at most 30000 deposition cycles, or from at least 10 to at most 3000 deposition cycles, or from at least 10 to at most 1000 deposition cycles, or from at least 10 to at most 500 deposition cycles, or from at least 20 to at most 200 deposition cycles, or from at least 50 to at most 150 deposition cycles, or from at least 75 to at most 125 deposition cycles, for example 100 deposition cycles.

In some embodiments, the precursor pulse and the plasma pulse at least partially overlap. In other words, and in some embodiments, the precursor pulse and the plasma pulse occur at least partially simultaneously. In such embodiments, the cyclical deposition process does not contain an intra-cycle purge. In some embodiments, the cyclical deposition process does not contain an inter-cycle purge.

In some embodiment, the reaction chamber is not purged between the precursor pulse and the plasma pulse. Nevertheless, in some embodiments, the precursor pulse and the plasma pulse can be separated by an intra-cycle purge. Note that, in this case, the intra-cycle purge is kept sufficiently short such as not to dilute the precursor concentration in the reaction chamber to an appreciable extent. In other words, the duration of the purge steps and the flow rate of purge gas is selected to be sufficiently low as to ensure that not all precursor has been removed from the reaction chamber after the purge step has finished. In other words, the duration of the purge steps and purge gas flow rates used therein can be sufficiently low such that the entire reaction chamber is not evacuated during a purge step.

In some embodiments, the duration of the precursor pulse is from at least 0.25 s to at most 4.0 s, or from at least 0.5 s to at most 2.0 s, or from at least 1.0 s to at most 1.5 s.

In some embodiments, the duration of the intra-cycle purge is from at least 0.025 s to at most 2.0 s, or from at least 0.05 s to at most 0.8 s, or from at least 0.1 s to at most 0.4 s, or from at least 0.2 s to at most 0.3 s.

In some embodiments, the RF on time, i.e. the duration of a plasma pulse, that is the time during which RF power is provided during a plasma pulse, is from at least 0.5 s to at most 4.0 s, or from at least 0.7 s to at most 3.0 s, or from at least 1.0 s to at most 2.0 s, or from at least 1.25 s to at most 1.75 s, or of about 1.5 s.

In some embodiments, the inter-cycle purge has a duration from at least 0.1 s to at most 2.0 s, or from at least 0.1 to at most 1.5 s for example 1.0 s.

In some embodiments, the plasma pulses comprise generating an RF plasma in the reaction chamber. In some embodiments, a plasma power of at least 10 W to at most 500 W is used during the plasma pulses. In some embodiments, a plasma power of at least 20 W to at most 150 W is used during the plasma pulses. In some embodiments, a plasma power of at least 30 W to at most 100 W is used during the plasma pulses. In some embodiments, a plasma power of at least 35 W to at most 75 W is used during the plasma pulses. In some embodiments, a plasma power of at least 40 W to at most 50 W is used during the plasma pulses.

In some embodiments, a plasma frequency of at least 40 kHz to at most 2.45 GHz is used for generating the plasma, or a plasma frequency of at least 40 kHz to at most 80 kHz is used for generating the plasma, or a plasma frequency of at least 80 kHz to at most 160 kHz is used for generating the plasma, or a plasma frequency of at least 160 kHz to at most 320 kHz is used for generating the plasma, or a plasma frequency of at least 320 kHz to at most 640 kHz is used for generating the plasma, or a plasma frequency of at least 640 kHz to at most 1280 kHz is used for generating the plasma, or a plasma frequency of at least 1280 kHz to at most 2500 kHz is used for generating the plasma, or a plasma frequency of at least 2.5 MHz to at least 5 MHz is used is used for generating the plasma, or a plasma frequency of at least 5 MHz to at most 50 MHz is used is used for generating the plasma, or a plasma frequency of at least 5 MHz to at most 10 MHz is used is used for generating the plasma, or a plasma frequency of at least 10 MHz to at most 20 MHz is used is used for generating the plasma, or a plasma frequency of at least 20 MHz to at most 30 MHz is used is used for generating the plasma, or a plasma frequency of at least 30 MHz to at most 40 MHz is used is used for generating the plasma, or a plasma frequency of at least 40 MHz to at most 50 MHz is used is used for generating the plasma, or a plasma frequency of at least 50 MHz to at most 100 MHz is used is used for generating the plasma, or a plasma frequency of at least 100 MHz to at most 200 MHz is used is used for generating the plasma, or a plasma frequency of at least 200 MHz to at most 500 MHz is used is used for generating the plasma, or a plasma frequency of at least 500 MHz to at most 1000 MHz is used is used for generating the plasma, or a plasma frequency of at least 1 GHz to at most 2.45 GHz is used is used for generating the plasma. In exemplary embodiments, the plasma is an RF plasma, and RF power is provided at a frequency of 13.56 MHz.

In some embodiments, a method as described herein is carried out at a temperature of at least −25° C. to at most 150° C. In some embodiments, the present methods are executed at a temperature of at least −25° C. to at most 200° C. In some embodiments, the present methods are executed at a temperature of at least −25° C. to at most 0° C. In some embodiments, the present methods are executed at a temperature of at least 0° C. to at most 25° C. In some embodiments, the present methods are executed at a temperature of at least 25° C. to at most 50° C. In some embodiments, the present methods are executed at a temperature of at least 50° C. to at most 75° C. In some embodiments, the present methods are executed at a temperature of at least 75° C. to at most 150° C. In some embodiments, the present methods are executed at a temperature of at least 150° C. to at most 200° C.

In some embodiments, a method as described herein is carried out at a pressure of at least 500 Pa. In some embodiments, the reaction chamber is maintained at a pressure of at least 600 Pa to at most 10000 Pa. For example, the pressure in the reaction chamber may be maintained at a pressure of at least 600 Pa to at most 1200 Pa, or at a pressure of at least 1200 Pa to at most 2500 Pa, or at a pressure of at least 2500 Pa to at most 5000 Pa, or at a pressure of at least 5000 Pa to at most 10000 Pa. This enhances the gap filling properties of the presently provided gap filling fluids.

In some embodiments, a method as described herein is carried out at a pressure of at least 500 Pa to at most 1500 Pa, and at a temperature of at least 50° C. to at most 150° C. In some embodiments, a method as described herein is carried out at a pressure of at least 500 Pa to at most 10 000 Pa and at a temperature of at least 50° C. to at most 200° C. In some embodiments, a method as described herein is carried out at a pressure of at least 700 Pa and at a temperature of at least 50° C. to at most 150° C. In some embodiments, a method as described herein is carried out at a pressure of at least 900 Pa, and at a temperature of at least 50° C. to at most 75° C.

Flowable films may be temporarily obtained when a volatile precursor is polymerized by a plasma and deposited on a surface of a substrate, wherein gaseous precursors (e.g. monomers) are activated or fragmented by energy provided by plasma gas discharge so as to initiate polymerization, and when the resultant material is deposited on the surface of the substrate, the material shows temporarily flowable behavior. In accordance with exemplary embodiments, when the deposition step is complete, the flowable film is no longer flowable but is solidified, and thus, a separate solidification process is not required. In other embodiments, the flowable film is densified and/or solidified after deposition. Densifying and/or solidifying the flowable film can be done by means of a curing step (also called "cure").

Accordingly, in some embodiments, the method includes a step of curing the gap filling fluid. This step increases the thermal resistance of the gap filling fluid. In other words, it increases the resistance of the gap filling fluid against deformation and/or mass loss at elevated temperatures. Additionally or alternatively, the curing step may cause the gap filling fluid to solidify.

In some embodiments, a curing step comprises generating a plasma in the reaction chamber, thus exposing the substrate to a direct plasma. Suitable direct plasmas comprise noble gas plasmas. When a direct plasma is used, a thin layer of gap filling fluid may be efficiently cured, yielding a thin high-quality layer. In some embodiments, especially when a thicker layer of cured gap filling fluid is desired, the method for filling a gap may comprise a plurality of cycles in which gap filling fluid deposition steps and curing steps employing a direct plasma treatment are alternated. In such embodiments, the process of filling a gap preferably comprises a plurality of cycles and gap filling fluid deposition and plasma treatment steps, also called pulses, are alternated. Such a cyclic process has the advantage that a larger portion of the gap filling fluid is cured: a direct plasma can have a penetration depth of around 2 to 7 nm, such that a post deposition direct plasma treatment would only cure a top layer of the gap filling fluid. Conversely, alternating deposition and plasma steps allows curing a larger part, or even the entirety of the gap filling fluid, even when using a curing technique that can have a low penetration depth, such as a direct plasma.

Suitable plasma treatments include a $H_2$ plasma, a He plasma, a $H_2$/He plasma, an Ar plasma, an Ar/$H_2$ plasma, and an Ar/He/$H_2$ plasma. It shall be understood that a $H_2$ plasma refers to a plasma that employs $H_2$ as a plasma gas. Also, it shall be understood that a $H_2$/He plasma refers to a plasma that employs a mixture of $H_2$ and He as a plasma gas. It shall be understood that other plasmas are defined analogously.

In some embodiments, a curing step comprises providing a remote plasma, e.g. a remote noble gas plasma, and exposing the substrate to one or more excited species such as at least one of radicals, ions, and UV radiation. In some embodiments, the step of curing comprises the use of an indirect plasma after the gap has been filled with the gap filling fluid. An indirect plasma can have a larger penetration depth than a direct plasma, thereby obviating the need for cyclic deposition and curing steps. Thus, an indirect plasma cure may be applied post deposition.

In some embodiments, the step of curing comprises providing a remote plasma source, and positioning one or more mesh plates between the remote plasma source and the substrate. Thus, the substrate can be exposed to radicals generated by the remote plasma source. The radicals have a penetration depth which is significantly higher than the penetration depth offered by direct plasmas, e.g. significantly higher than the size of the gaps to be filled by means of the presently provided methods. Consequently, a remote plasma treatment may be advantageously applied once after all the gap filling fluid has been deposited. This notwithstanding, a remote plasma cure may also be applied cyclically with alternating plasma cure and gap filling fluid deposition steps, similar to the operation with a direct plasma. The large penetration depths of remote plasmas have the advantage that they allow efficient curing of gap filling fluid. In some embodiments, the plasma gas employed in a remote plasma comprises a noble gas, for example a noble gas selected from the list consisting of He and Ar.

In some embodiments, a method as described herein comprises one or more cycles. A cycle comprises a gap fill forming step and a curing step. The gap fill forming step comprises introducing the reaction gas in the reaction chamber and generating the plasma in the reaction chamber.

In some embodiments, the gap filling fluid is cured after it has been deposited. Optionally, the gap filling fluid is subjected to an anneal after the gap filling fluid has been deposited and before the curing step. Suitable annealing times include from at least 10.0 seconds to at most 10.0 minutes, for example from at least 20.0 seconds to at most 5.0 minutes, for example from at least 40.0 seconds to at most 2.5 minutes. Suitably, the anneal is performed in a gas mixture comprising one or more gasses selected from the list consisting of $N_2$, He, Ar, and $H_2$. In some embodiments, the anneal is carried out at a temperature of at least 200° C., or at a temperature of at least 250° C., or at a temperature of at least 300° C., or at a temperature of at least 350° C., or at a temperature of at least 400° C., or at a temperature of at least 450° C.

A step of curing may reduce the hydrogen concentration of the gap filling fluids with respect to their uncured state. For example, the hydrogen concentration is reduced by at least 0.01 atomic percent to at most 0.1 atomic percent, or by at least 0.1 atomic percent to at most 0.2 atomic percent, or by at least 0.2 atomic percent to at most 0.5 atomic percent, or by at least 0.5 atomic percent to at most 1.0 atomic percent, or by at least 1.0 atomic percent to at most 2.0 atomic percent, or by at least 2.0 atomic percent to at most 5.0 atomic percent, or by at least 5.0 atomic percent to at most 10.0 atomic percent.

In some embodiments, the step of curing comprises exposing the gap filling fluid to a micro pulsed plasma. The application of a micro-pulsed plasma can be particularly advantageous when the as-deposited gap filling fluid comprises hydrogen. A micro pulsed plasma is a plasma treatment that comprises the application of a plurality of rapidly succeeding on-off micro pulses. The micro pulsed plasma may, for example, employ a noble gas as a plasma gas. When a 300 mm wafer is used as a substrate, a plasma gas flow rate of, for example, at least 5.0 slm, or of at least 5.0 slm to at most 7.0 slm, or of at least 7.0 slm to at most 10.0 slm is maintained during the micro pulsed plasma. For example, the on micro pulses in a micro pulsed plasma may last from at least 1.0 us to at most 1.0 s, or from at least 2.0 us to at most 0.50 s, or from at least 5.0 μs to at most 250 ms, or from at least 10.0 μs to at most 100.0 ms, or from at least 25.0 μs to at most 50.0 ms, or from at least 50.0 μs to at most 25.0 ms, or from at least 100.0 μs to at most 10.0 ms, or from at least 250.0 μs to at most 5.0 ms, or from at least 0.50 ms to at most 2.5 ms. For example, the off micro pulses in a micro pulsed plasma may last from at least 1.0 μs to at most 2.0 s, or from at least 2.0 μs to at most 1.0 s, or from at least 5.0 μs to at most 500 ms, or from at least 10.0 μs to at most 250.0 ms, or from at least 25.0 μs to at most 100.0 ms, or from at least 50.0 μs to at most 50.0 ms, or from at least 100.0 μs to at most 25.0 ms, or from at least 200.0 μs to at most 10.0 ms, or from at least 500.0 μs to at most 5.0 ms, or from at least 1.0 ms to at most 2.0 ms. A micro pulsed plasma may be used cyclically, i.e. as a plasma pulse in a cyclical deposition treatment, and/or as a post-deposition treatment. In other words, a process of filling a gap may comprise alternating cycles of gap filling fluid deposition and micro pulsed plasma. Additionally or alternatively, the substrate may be subjected to a micro pulsed plasma post-deposition treatment after all gap filling fluid has been deposited.

In some embodiments, the step of curing involves the use of ultraviolet (UV) light. In other words, the step of curing may involve exposing the substrate, including the gap filling fluid, to UV radiation. Such a curing step employing UV light may be called a UV cure.

In some embodiments, a UV cure is used as a post-deposition treatment. In other words, in some embodiments, the present methods can comprise depositing a gap filling fluid, and after all gap filling fluid has been deposited, subjecting the gap filling fluid to a UV cure.

In some embodiments, the present methods comprise a cyclic process comprising a plurality of cycles, the cycles each comprising a gap filling fluid deposition step and a UV curing step. The UV curing step may be separated by a purge step. Additionally or alternatively, subsequent cycles may be separated by a purge step. Suitable purge steps are described elsewhere herein.

In an exemplary embodiment, an exemplary curing step is discussed. The curing step may employ a continuous direct plasma for 20 seconds. Gap filling fluid deposition steps and direct plasma curing steps may be carried out cyclically, i.e. gap filling fluid deposition steps and curing steps may be executed alternatingly. This allows efficiently curing all, or at least a large portion, of the gap filling fluid. For curing gap filling fluid in gaps on a 300 mm substrate, each direct plasma curing step can feature, for example, 20 seconds of He plasma at an RF power of 200 W and a working pressure of 600 Pa. The reactor volume is ca. 1 liter and the He flow rate is 2 slm.

As a further exemplary embodiment, another exemplary curing step is discussed. The curing step may involve exposing the gap filling fluid to a micro pulsed plasma. In the present example, the curing step may be carried out cyclically, i.e. alternating cycles of gap filling fluid deposition and micro pulsed RF plasma are employed, though a post-deposition micro pulsed plasma curing treatment is possible as well. The application of cyclic gap filling fluid deposition and plasma steps allows efficiently curing all, or at least a large portion, of the gap filling fluid. For curing gap filling fluid in gaps on a 300 mm substrate, each direct curing step may feature 200 micropulses comprising 0.1 seconds of plasma on time and 0.5 seconds of plasma off time. The curing step may employ a He plasma at 400 Pa. The RF power provided may be 200 W. A He flow of 10 slm may be employed.

In some embodiments, the method includes a step of curing the gap filling fluid such that the carbon concentration of the cured gap filling fluid is reduced with respect to the uncured gap filling fluid. Such a curing step may also sometimes be referred to as an 'ash-back'. It is particularly advantageous when the gap filling fluid comprises a metal (and carbon), as such a curing step allows to (at least partially) convert the gap filling fluid towards a metal oxide, metal nitride or even a metal such. In doing so, the metal-content in the cured gap filling fluid—and the density of said gap filling fluid—is typically increased. Accordingly, it advantageously offers an alternative approach to providing a metal oxide, metal nitride or metal into a gap. Moreover, this alternative approach can be performed without the use of halogens, so that substrate etch concerns can advantageously be appeased. In some embodiments, the metal may be Ta, V, Hf, Zr, or Mo. In some embodiments, gap filling fluid deposition steps and direct plasma curing steps to reduce the carbon concentration may be carried out cyclically, i.e. gap filling fluid deposition steps and curing steps may be executed alternatingly.

In some embodiments, curing the gap filling fluid such that the carbon concentration of the cured gap filling fluid is reduced with respect to the uncured gap filling fluid comprises generating a plasma in the reaction chamber, thus exposing the substrate to a direct plasma. Suitable direct plasmas therefore comprise an $O_2$ plasma, $N_2$ plasma, $NH_3$ plasma and/or $H_2$ plasma. For example, a gap filling fluid comprising a metal may be converted towards a metal oxide using an $O_2$-based plasma treatment; towards a metal nitride using an $N_2$- and/or $NH_3$-based plasma treatment; or towards a metal using an $H_2$-based plasma treatment.

In some embodiments, the curing may reduce the carbon concentration of the cured gap filling fluid with respect to the uncured gap filing fluid by at least 1.0 atomic percent to at most 5.0 atomic percent, or by at least 5.0 atomic percent to at most 10.0 atomic percent, or by at least 10.0 atomic percent to at most 30.0 atomic percent, or by at least 30.0 atomic percent to at most 50.0 atomic percent, or by at least 50.0 atomic percent to at most 70.0 atomic percent, or by at least 70.0 atomic percent to at most 90.0 atomic percent. In some embodiments, the curing may reduce the carbon concentration of the cured gap filling fluid to from at most 70.0 atomic percent to at least 60.0 atomic percent, or from at most 60.0 atomic percent to at least 50.0 atomic percent, or from at most 50.0 atomic percent to at least 40.0 atomic percent, or from at most 40.0 atomic percent to at least 30.0 atomic percent, or from at most 30.0 atomic percent to at least 20.0 atomic percent, or from at most 20.0 atomic percent to at least 10.0 atomic percent, or from at most 10.0 atomic percent to at least 5.0 atomic percent, or from at most 5.0 atomic percent to at least 2.0 atomic percent, or from at most 2.0 atomic percent to at least 0.1 atomic percent, or substantially 0.0 atomic percent.

In some embodiments, the method is executed in a system comprising two electrodes between which the substrate is positioned. The electrodes are positioned parallel at a predetermined distance called an electrode gap. In some embodiments, the electrode gap is at least 5 mm to at most 30 mm, at least 5 mm to at most 10 mm, or at least 10 mm to at most 20 mm, or of at least 20 mm to at most 30 mm.

In some embodiments, the methods are executed using a system comprising two or more precursor sources including a first precursor source, a second precursor source, optionally a third precursor source, and optionally more precursor sources. A precursor source can suitably comprise a precursor recipient, e.g. a precursor canister, a precursor bottle, or the like; and one or more gas lines operationally connecting the precursor recipient to the reaction chamber. In particular, the first precursor source can comprise a first precursor recipient comprising a first precursor, the second precursor source can comprise a second precursor recipient comprising a second precursor, and so on. In such embodiments, a precursor recipient may be suitably maintained at a temperature which is from at least 5° C. to at most 50° C. lower than the temperature of the reaction chamber, or at a temperature which is from at least 5° C. to at most 10° C. lower than the temperature of the reaction chamber, or at a temperature which is from at least 10° C. to at most 20° C. lower than the temperature of the reaction chamber, or at a temperature which is from at least 30° C. to at most 40° C. lower than the temperature of the reaction chamber, or at a temperature which is from at least 40° C. to at most 50° C. lower than the temperature of the reaction chamber. The gas lines may be suitably maintained at a temperature between the temperature of the respective precursor recipient and the reaction chamber. For example, the gas lines may be maintained at a temperature which is from at least 5° C. to at most 50° C., or from at least 5° C. to at most 10° C., or from at least 10° C. to at most 20° C., or from at least 30° C. to at most 40° C., or from at least 40° C. to at most 50° C. lower than the temperature of the reaction chamber. In some embodiments, at least a part of the gas lines and the reaction chamber are maintained at a substantially identical temperature which is higher than the temperature of the precursor recipient.

In some embodiments, the substrate is subjected to a micro pulsed plasma while a plasma gas is provided to the reaction chamber at a flow rate that is higher than a predetermined threshold. The combination of a micro pulsed plasma with these high flow rates minimizes redeposition of volatile by products released during plasma-induced cross linking of the deposited gap filling fluid. In some embodiments, the flow rate of the plasma gas during micro pulsed plasma treatment is at least 5.0 slm (standard liter per minute), preferably at least 10.0 slm. The skilled artisan understands that this flow rate depends on reaction chamber volume and substrate size, and the values provided here for 300 mm wafers and a reaction chamber volume of 1 liter can be readily transferred to other substrate sizes and/or reactor volumes. In some embodiments, a noble gas is used as a plasma gas during micro pulsed plasma treatment. In some embodiments, the noble gas is selected from He and Ar.

Further described herein is a system. The system comprises a reaction chamber. The reaction chamber comprises a substrate support and an upper electrode. The substrate support comprises a lower electrode. The system further comprises a radio frequency power source. The radio frequency power source is arranged for generating a radio frequency power waveform. The system further comprises a gas injection system. The gas injection system is in fluid connection with the reaction chamber. The system further comprises a first precursor gas source and a second precursor gas source. The first precursor gas source is arranged for introducing a first precursor and optionally a carrier gas in the reaction chamber. The second precursor gas source is arranged for introducing a second precursor and optionally a carrier gas in the reaction chamber. The system further comprises an exhaust. The system further comprises a controller that is arranged to cause the system to carry out a method as described herein. The controller(s) communicate with the various power sources, heating systems, pumps, robotics, and gas flow controllers or valves of the system, as will be appreciated by the skilled artisan.

In some embodiments, the precursor source comprises a precursor recipient, e.g. a precursor canister, a precursor bottle, or the like; and one or more gas lines operationally connecting the precursor recipient to the reaction chamber. In such embodiments, the precursor recipient may be suitably maintained at a temperature which is from at least 5° C. to at most 50° C. lower than the temperature of the reaction chamber, or at a temperature which is from at least 5° C. to at most 10° C. lower than the temperature of the reaction chamber, or at a temperature which is from at least 10° C. to at most 20° C. lower than the temperature of the reaction chamber, or at a temperature which is from at least 30° C. to at most 40° C. lower than the temperature of the reaction chamber, or at a temperature which is from at least 40° C. to at most 50° C. lower than the temperature of the reaction chamber. The gas lines may be suitably maintained at a temperature between the temperature of the precursor recipient and the reaction chamber. For example, the gas lines may be maintained at a temperature which is from at least 5° C. to at most 50° C., or from at least 5° C. to at most 10° C., or from at least 10° C. to at most 20° C., or from at least 30° C. to at most 40° C., or from at least 40° C. to at most 50° C. lower than the temperature of the reaction chamber. In some embodiments, the gas lines and the reaction chamber are maintained at a substantially identical temperature which is higher than the temperature of the precursor recipient.

In some embodiments, the gas injection system comprises a precursor delivery system that employs a carrier gas for carrying the precursor to one or more reaction chambers. In some embodiments, continuous flow of carrier gas is accomplished using a flow-pass system. In the flow-pass system, a carrier gas line is provided with a detour line having a precursor reservoir (bottle), and the main line and the detour line are switched, wherein when only a carrier gas is intended to be fed to a reaction chamber, the detour line is closed, whereas when both the carrier gas and the precursor gas are intended to be fed to the reaction chamber, the main line is closed and the carrier gas flows through the detour line and flows out from the bottle together with the precursor gas. In this way, the carrier gas can continuously flow into the reaction chamber and can carry the precursor gas in pulses by switching the main line and the detour line.

Figure 1:
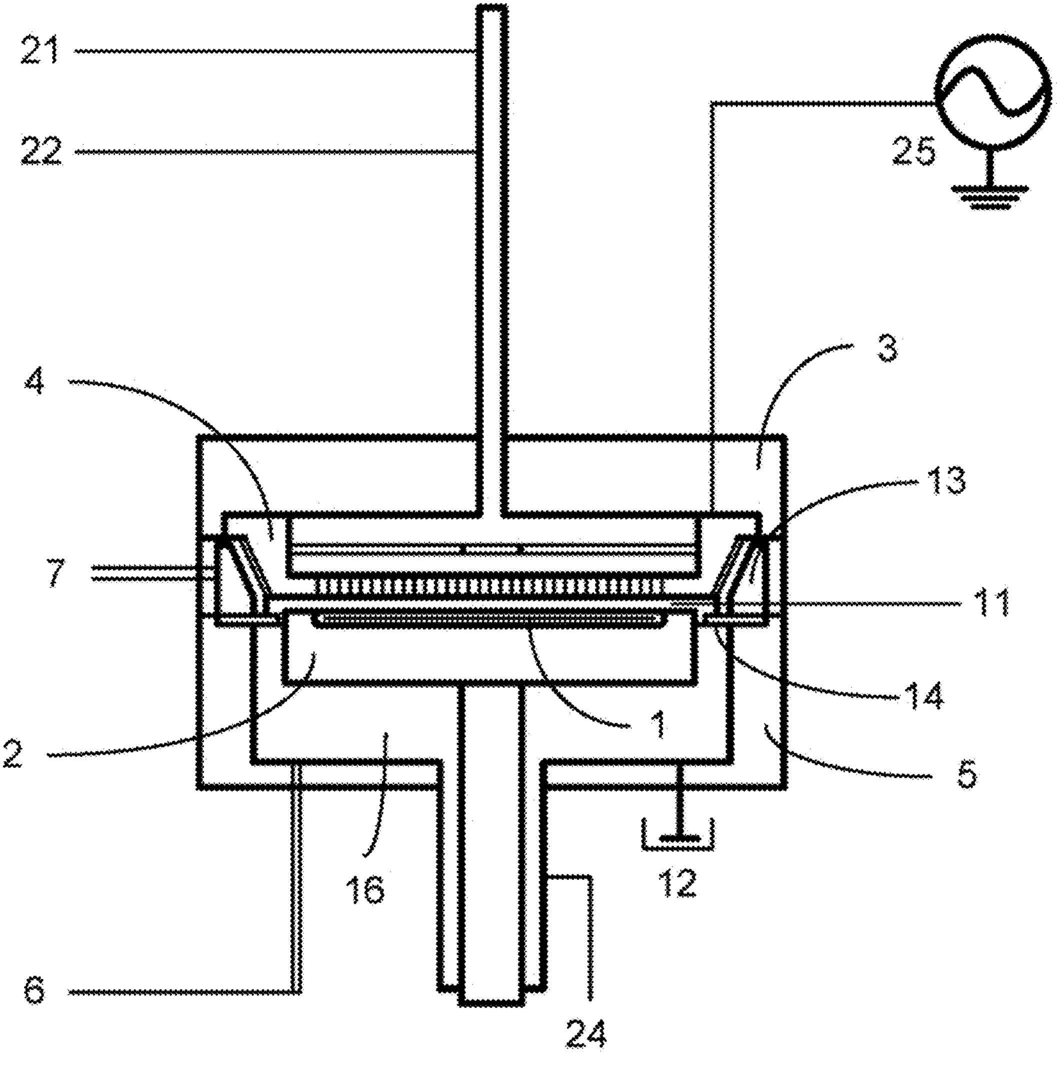

The presently provided methods may be executed in any suitable apparatus, including in a reactor as shown in FIG. 1. Similarly, the presently provided structures may be manufactured in any suitable apparatus, including a reactor as shown in FIG. 1. FIG. 1 is a schematic view of a plasma-enhanced atomic layer deposition (PEALD) apparatus, desirably in conjunction with controls programmed to conduct the sequences described below, usable in some embodiments of the present invention. In this figure, by providing a pair of electrically conductive flat-plate electrodes (2,4) in parallel and facing each other in the interior (11) (reaction zone) of a reaction chamber (3), applying RF power (e.g. at 13.56 MHz and/or 27 MHz) from a power source (25) to one side, and electrically grounding the other side (12), a plasma is excited between the electrodes. A temperature regulator may be provided in a lower stage (2), i.e. the lower electrode. A substrate (1) is placed thereon and its temperature is kept constant at a given temperature. The upper electrode (4) can serve as a shower plate as well, and a reactant gas and/or a dilution gas, if any, as well as a precursor gas can be introduced into the reaction chamber (3) through a gas line (21) and a gas line (22), respectively, and through the shower plate (4). Additionally, in the reaction chamber (3), a circular duct (13) with an exhaust line (7) is provided, through which the gas in the interior (11) of the reaction chamber (3) is exhausted. Additionally, a transfer chamber (5) is disposed below the reaction chamber (3) and is provided with a gas seal line (24) to introduce seal gas into the interior (11) of the reaction chamber (3) via the interior (16) of the transfer chamber (5) wherein a separation plate (14) for separating the reaction zone and the transfer zone is provided. Note that a gate valve through which a wafer may be transferred into or from the transfer chamber (5) is omitted from this figure. The transfer chamber is also provided with an exhaust line (6). In some embodiments, depositing the gap filling fluid and curing the gap filling fluid is done in one and the same reaction chamber. In some embodiments, forming the gap filling fluid and curing the gap filling fluid is done in separate reaction chambers comprised in one and the same system.

Figure 2A:
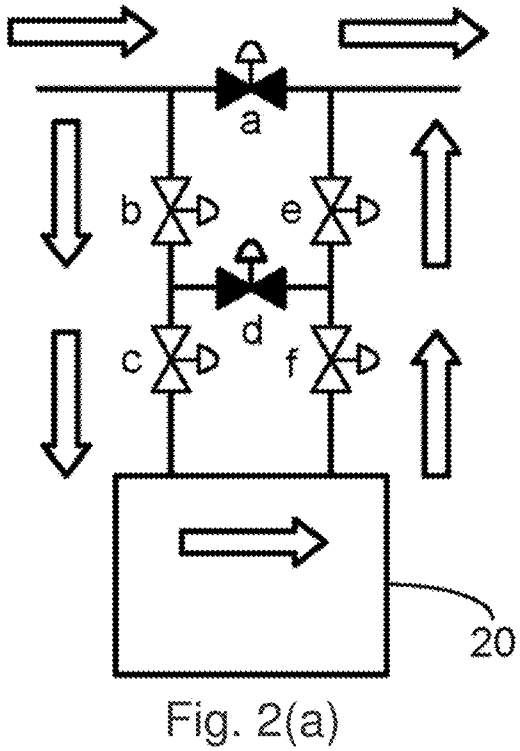
Figure 2B:
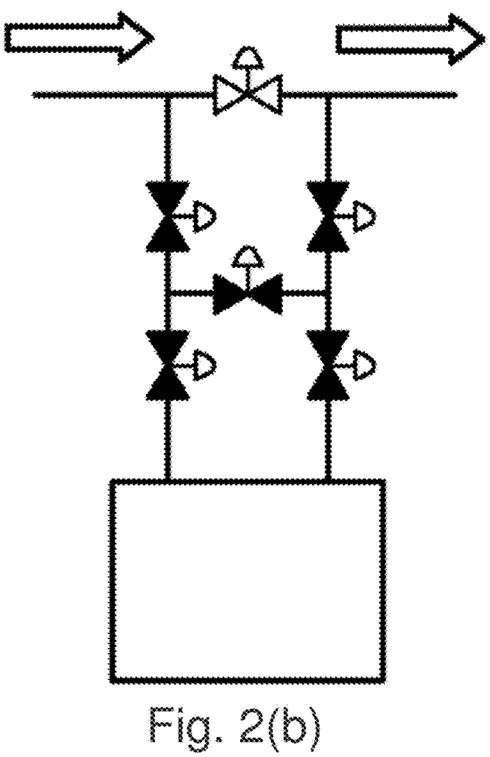

In some embodiments, the system of switching flow of an inactive gas and flow of a precursor gas illustrated in FIGS. 2(*a*) and 2(*b*) can be used in an apparatus according to FIG. 1 to introduce the precursor gas in pulses without substantially fluctuating pressure of the reaction chamber. Indeed, a continuous flow of the carrier gas can be accomplished using a flow-pass system (FPS) wherein a carrier gas line is provided with a detour line having a precursor reservoir (bottle), and the main line and the detour line are switched, wherein when only a carrier gas is intended to be fed to a reaction chamber, the detour line is closed, whereas when both the carrier gas and a precursor gas are intended to be fed to the reaction chamber, the main line is closed and the carrier gas flows through the detour line and flows out from the bottle together with the precursor gas. In this way, the carrier gas can continuously flow into the reaction chamber and can carry the precursor gas in pulses by switching the main line and the detour line.

FIGS. 2(*a*) and 2(*b*) illustrate a precursor supply system using a flow-pass system (FPS) that can be used in an embodiment of a system as described herein (black valves indicate that the valves are closed). As shown in FIG. 2(*a*), when feeding a precursor to a reaction chamber (not shown), first, a carrier gas such as Ar (or He) flows through a gas line with valves b and c, and then enters a bottle (reservoir) (20). The carrier gas flows out from the bottle (20) while carrying a precursor gas in an amount corresponding to a vapor pressure inside the bottle (20) and flows through a gas line with valves f and e and is then fed to the reaction chamber together with the precursor. In the above, valves a and d are closed. When feeding only the carrier gas (which can be a noble gas such as He or Ar) to the reaction chamber, as shown in FIG. 2(*b*), the carrier gas flows through the gas line with the valve a while bypassing the bottle (20). In the above, valves b, c, d, e, and f are closed.

A skilled artisan will appreciate that the apparatus includes one or more controller(s) (not shown) programmed or otherwise configured to cause the deposition process described elsewhere herein to be conducted. The controller(s) communicate with the various power sources, heating systems, pumps, robotics and gas flow controllers or valves of the reactor, as will be appreciated by the skilled artisan. The controller(s) include electronic circuitry including a processor, and software to selectively operate valves, manifolds, heaters, pumps and other components included in the system. Such circuitry and components operate to introduce precursors, reactants, and optionally purge gases from the respective sources (e.g., bottle 20). The controller can control timing of gas supply sequences, temperature of the substrate and/or reaction chamber (3), pressure within the reaction chamber (3), and various other operations to provide proper operation of the system. The controller(s) can include control software to electrically or pneumatically control valves to control flow of precursors, reactants and purge gases into and out of the reaction chamber (3). Controller(s) can include modules such as a software or hardware component, e.g., a FPGA or ASIC, which performs certain tasks. It shall be understood that where the controller includes a software component to perform a certain task, the controller is programmed to perform that particular task. A module can advantageously be configured to reside on the addressable storage medium, i.e. memory, of the control system and be configured to execute one or more processes.

Optionally, a dual chamber reactor can be used. A dual chamber reactor comprises two sections or compartments for processing wafers disposed close to each other. In such a dual chamber reactor, a reactant gas and a noble gas can be supplied through a shared line and precursor-containing gases are provided by means of unshared lines. In exemplary embodiments, forming a gap filling fluid occurs in one of the two compartments, and the step of curing occurs in another reaction chamber. This can advantageously improve throughput, e.g. when gap filling fluid formation and curing occur at different temperatures, then gap filling fluid formation can be done in one reaction chamber and curing can be done in an adjacent reaction chamber.

Figure 3:
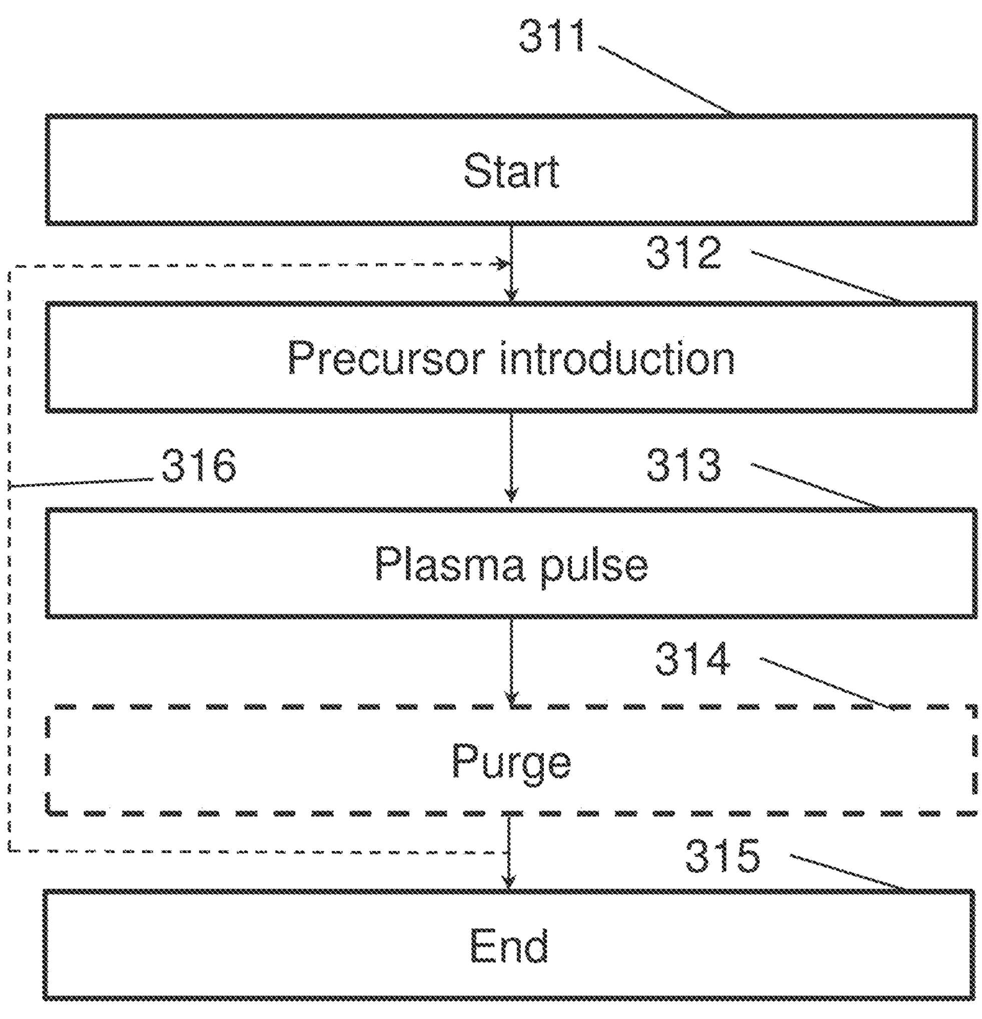
FIG. 3 shows an embodiment of a method as described herein.

FIG. 3 shows a schematic representation of an embodiment a method for filling a gap. The method starts (311) after providing a substrate to a reaction chamber, and comprises a precursor introduction step (312) in which a first precursor and a second precursor are introduced to the reaction chamber. The method then comprises a plasma pulse (313) in which the substrate is subjected to a plasma treatment. During the plasma treatment, the first precursor and the second precursor react to form a gap filling fluid. Optionally, the reaction chamber is then purged in an inter-cycle purge (314). It shall be understood that no plasma is generated in the reaction chamber during the purges (314). Optionally, the precursor introduction step (312) and the plasma pulse (313) are repeated (316) one or more times.

Thus, a material is formed in the gap. Advantageously, the composition of the material can be controlled by controlling the relative amounts of first precursor and second precursor that are introduced into the reaction chamber. When a desired amount of material is formed in the gap, the method ends (315).

Figure 4:
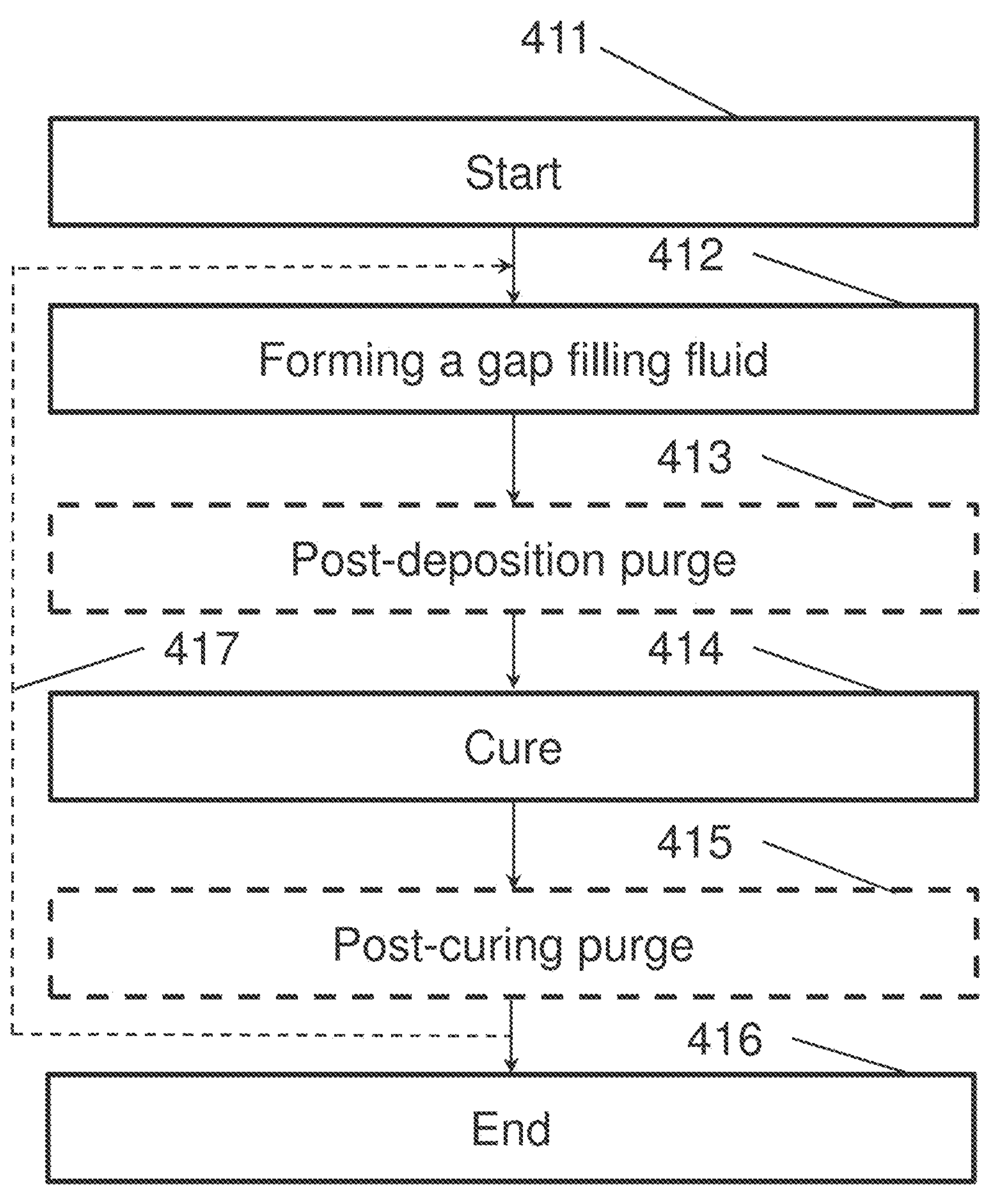
FIG. 4 shows an embodiment of a method as described herein.

FIG. 4 shows a schematic representation of an embodiment of a method as disclosed herein. The method starts (411) after providing a substrate to a reaction chamber. The method comprises a step (412) of forming a gap filling fluid on the substrate. Optionally, the reaction chamber is then purged by means of a post-deposition purge (413). The method then comprises a step (414) of curing the gap filling fluid. Optionally, the reaction chamber is then purged by means of a post-cure purge (415). Optionally, the steps from the step (412) of depositing a gap filling fluid on the substrate to the step (414) of curing the gap filling fluid are repeated (417) one or more times. Optionally, subsequent cycles are separated by the post-cure purge (415). The resulting deposition-cure cycles can be repeated until a desired thickness of cured gap filling fluid has been deposited on the substrate.

Figure 5:
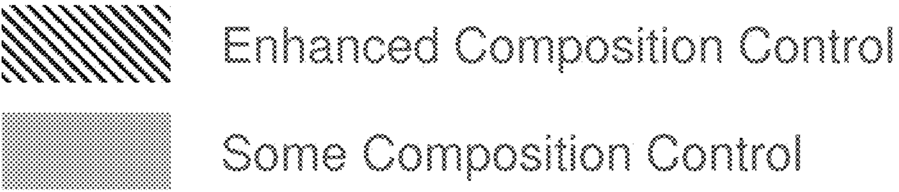
FIG. 5 illustrates the enhanced composition control that is achievable using embodiments of the methods that are described herein.

FIG. 5 shows how using different first precursors and second precursors allows enhanced composition control of gap filling fluids as opposed to processes that employ only a single precursor.

Indeed, when the first and second precursors contain different elements, then the gap filling fluid can have a composition that includes more elements than any one of the first and second precursor. For example, when the first precursor consists of B, N, and H; and the second precursor consists of Si, C, and H, then a gap filling fluid consisting of B, N, Si, C, and H can be formed, even though neither the first precursor nor the second precursor contains all of B, N, Si, C, and H.

When the first and second precursors contain the same elements, but in different amounts, then compositional control of the gap filling fluid is possible as well. For example, when the first precursor contains Si and a relatively low amount of C, and the second precursor contains Si and a relatively high amount of C, then the relative Si and C composition of the gap filling fluid can be controlled by controlling the relative amounts of the first and second precursor that are introduced into the reaction chamber: the more of the first precursor introduced into the reaction chamber vis-à-vis the second precursor, the higher the Si content and the lower the C content of the resulting gap filling fluid.

Plasma generation and precursor introduction can be done using any one of a number of pulsing schemes, such as the pulsing schemes shown in FIGS. 6 to 8.

FIG. 6(*a*) shows that, in some embodiments, a plasma can be continually generated in the reaction chamber while both the first precursor and the second precursor are continually provided to the reaction chamber. FIG. 6(*b*) shows that, in some embodiments, a plasma is continually generated in the reaction chamber while the first precursor is provided to the reaction chamber in a plurality of discrete pulses, and the second precursor is continually provided to the reaction chamber. FIG. 6(*c*) shows that, in some embodiments, a plasma is continually generated in the reaction chamber while the first precursor is continually provided to the reaction chamber and the second precursor is provided to the reaction chamber in discrete pulses.

FIG. 7(*a*) shows that, in some embodiments, a plasma can be continually generated in the reaction chamber while both the first precursor and the second precursor are provided to the reaction chamber in a plurality of discrete pulses. FIG. 7(*b*) shows that in some embodiments, a plasma can be generated in the reaction chamber in a plurality of discrete pulses while the first precursor is provided to the reaction chamber in a plurality of discrete pulses, and the second precursor is continually provided to the reaction chamber. FIG. 7(*c*) shows that, in some embodiments, a plasma can be generated in the reaction chamber in a plurality of discrete pulses while the first precursor and the second precursor are both provided to the reaction chamber in discrete pulses.

FIGS. 8(*a*)-(*c*) show that the same amount of precursor can be provided to a reaction chamber using multiple possible pulsing schemes. For example, in FIG. 8(*a*) the first precursor is continually provided to the reaction chamber and the second precursor is provided to the precursor at a flow rate that is half the flow rate at which the first precursor is provided to the reaction chamber. In the embodiment of FIG. 8(*a*), the second precursor is provided to the reaction chamber using relatively broad pulses which are spaced relatively far apart in time. In the embodiment of FIG. 8(*b*), the first precursor is also continually provided to the reaction chamber and the second precursor is also provided to the reaction chamber at a flow rate that is half the flow rate at which the first precursor is provided to the reaction chamber. This notwithstanding, and in the embodiment of FIG. 8(*b*), the second precursor is provided to the reaction chamber using relatively short pulses which swiftly follow one another.

In an exemplary embodiment, reference is made to FIGS. 9(*a*) and 9(*b*). FIGS. 9(*a*) and 9(*b*) schematically show a process that can be employed for forming a gap filling fluid according to an embodiment of a method as described herein. Exemplary process parameters for such an embodiment are described in Table 1.

TABLE 1

Figure 9A:
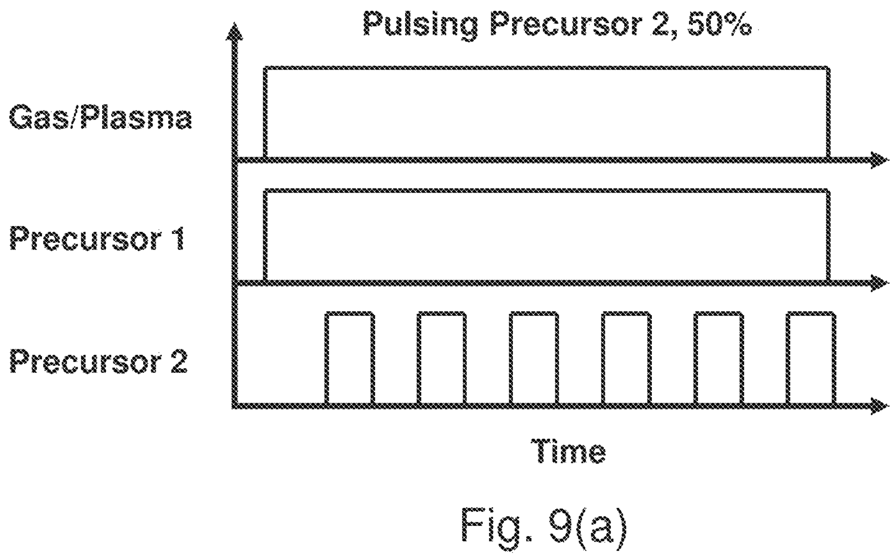
Figure 9B:
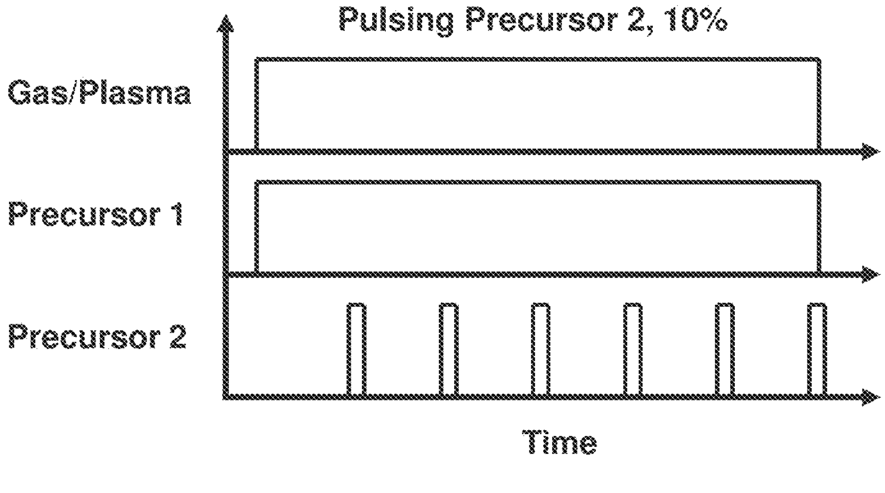

| Exemplary process parameters for a process according to the embodiment of FIGS. 9(a) and 9(b). | |
|---|---|
| Temp [° C.] | 75 |
| Ar [slm] | 4.3-6 |
| RC Press [Pa] | 700-900 |
| Power [W] | 50-100 |
| Precursor 1 on [%] | 10-100 |
| Precursor 2 on [%] | 10-100 |

In the embodiment of FIGS. 9(*a*) and 9(*b*), precursor 1 has a structure according to the following formula:

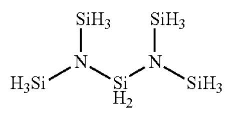

In the embodiment of FIGS. 9(*a*) and 9(*b*), precursor 2 is toluene.

In the embodiment of FIGS. 9(*a*) and 9(*b*), the process temperature is 75° C., and argon, which is used as a plasma gas, is provided to the reaction chamber continuously at a flow rate of 4.3 to 6 standard liters per minute (slm). The reaction chamber is maintained at a pressure of at least 700 to at most 900 Pa. A capacitive RF plasma is generated in the reaction chamber at a frequency of 13.56 MHz, and a plasma power of at least 50 to at most 100 W is used. Percentage on time of the first precursor is from at least 10% to at most 100%, and percentage on time of the second precursor was also from at least 10% to at most 100%. It shall be understood that in this embodiment, the first and second precursors are provided to the reaction chamber in discrete pulses which are separated by inter-pulse intervals, and that "percentage on time" refers to the ratio, in percent, of pulse duration over (pulse duration plus inter-pulse interval duration). The "percentage on time" can be used to control the composition of the gap filling fluid. Additionally or alternatively, the composition of the gap filling fluid can be further controlled by means of selecting the temperatures of the precursor sources, selecting precursors with a particular composition and a specific vapor pressure, and by changing carrier gas flow. Suitable carrier gasses include noble gasses such as Ar.

A process according to the embodiment of FIGS. 9(*a*) and 9(*b*) can advantageously be employed for forming a gap filling fluid with a carbon concentration in the range of 4 to 47 atomic percent, an oxygen concentration in the range of 9 to 40 atomic percent, a nitrogen concentration in the range of 10 to 15 atomic percent, and a silicon concentration in the range of 33 to 45 atomic percent. At 633 nm, the refractive index of such a gap filling fluid was found to be in the range of 1.46 to 1.57, thickness non-uniformity was in the range of 1.4 to 19.3%, wet etch rate in 0.5 vol. % aqueous HF was 0.9 to 20.5 (a.u.), and density of the gap filling fluids was from 1.03 to 1.19 $g/cm_3$. Thus, a method as described herein, and particularly a method according to the embodiment of FIGS. 9(*a*) and 9(*b*), can advantageously control the composition and properties of gap filling fluids.

FIGS. 10(*a*)-(*c*) show experimental results for a method according to the embodiment of FIGS. 9(*a*) and 9(*b*). In particular, FIG. 10(*a*) shows a transmission electron microscopy (TEM) micrograph for a gap filling fluid having a carbon content of 13.1 atomic percent, as measured by energy-dispersive X-ray spectroscopy (EDS). FIG. 10(*b*) show a TEM micrograph for a gap filling fluid having a carbon content of 29.0 atomic percent, as measured by EDS. FIG. 10(*c*) shows a TEM micrograph for a gap filling fluid having a carbon content of 39.5 atomic percent, as measured by EDS. These gap filling fluids show good flowability regardless of carbon content. It was observed that with increasing carbon content, the oxygen and silicon content of the gap filling fluids decrease, whereas the other elemental concentrations remain relatively constant.

In a further exemplary embodiment, reference is made to FIGS. 11(*a*) and 11(*b*). FIG. 11(*a*) schematically shows a process that can be employed for forming a gap filling fluid according to an embodiment of a method as described herein. Exemplary process parameters for such an embodiment are described in Table 2.

TABLE 2

Figure 11A:
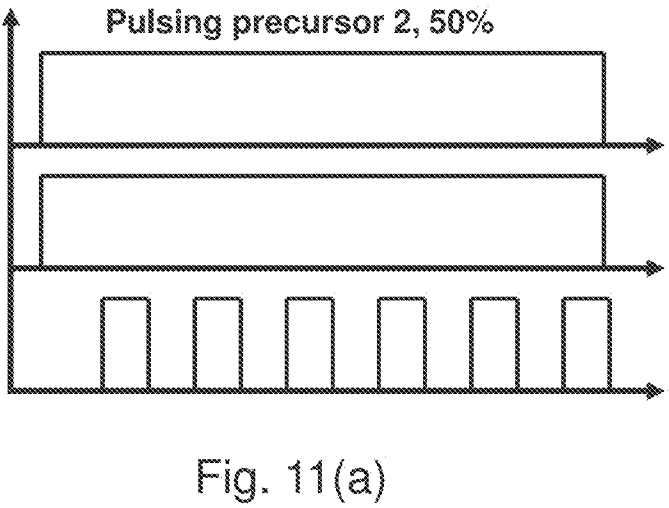
Figure 11B:
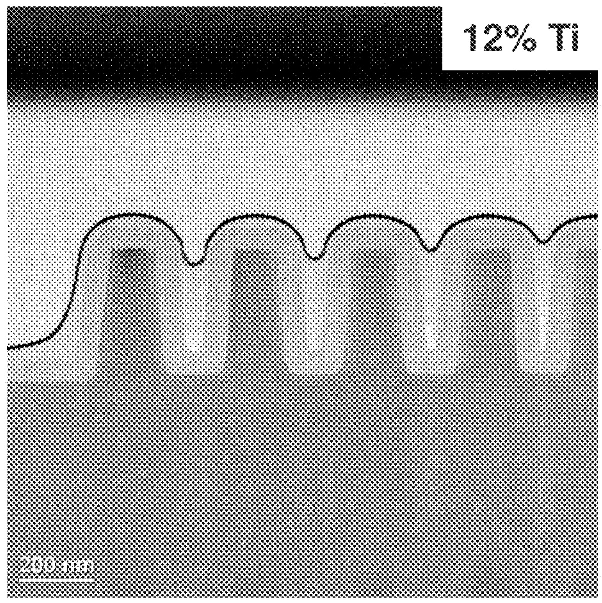

| Exemplary process parameters for a process according to the embodiment of FIGS. 11(a) and 11(b). | |
|---|---|
| Temp [° C.] | 75 |
| Ar [slm] | 4.3-6 |
| RC Press [Pa] | 700-900 |
| Power [W] | 50-100 |
| Precursor 1 on [%] | 100 |
| Precursor 2 on [%] | 10-100 |

In the embodiment of FIGS. 11(*a*) and 11(*b*), precursor 1 is toluene, and precursor 2 has a structure according to the following formula:

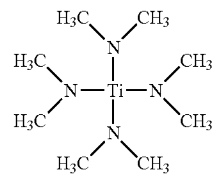

In the embodiment of FIGS. 11(*a*) and 11(*b*), the process temperature is 75° C., and argon, which is used as a plasma gas, is provided to the reaction chamber continuously at a flow rate of 4.3 to 6 standard liters per minute (slm). The reaction chamber is maintained at a pressure of at least 700 to at most 900 Pa. A capacitive RF plasma is generated in the reaction chamber at a frequency of 13.56 MHz, and a plasma power of at least 50 to at most 100 W is used. Percentage on time of the first precursor is 100%, and percentage on time of the second precursor was from at least 10% to at most 100%. As before, "percentage on time" refers to the ratio, in percent, of pulse duration over (pulse duration plus inter-pulse interval duration).

FIG. 11(*b*) shows that a process according to the embodiment of FIGS. 11(*a*) and 11(*b*) advantageously results in formation of a gap filling fluid with excellent flowability. This gap filling fluid has the following composition, in atomic percent: 62% C, 22.2% 0, 11.8% Ti, and 3.2% N. It has an aching rate in an $O_2$ plasma of 0.44 nm/s, for a capacitive plasma with the following plasma parameters: 400 Pa pressure, 100 W power, 13.56 MHz plasma frequency, 75° C. substrate temperature. It was found that the process parameters according to the embodiment of FIGS. 11(*a*) and 11(*b*) can be suitably used to control the composition of a gap filling fluid, in atomic percent, in the following range: 0-13% Ti, 1.3-23.2% O, 59.2-97.5% C, 0-3.8% N. The aching rate in an $O_2$ plasma generated using the aforementioned parameters can be controlled in the range of 0.37 nm/s to 1.2 nm/s.

In yet a further exemplary embodiment, reference is made to FIG. 12. For a process that can be employed for forming a gap filling fluid according to an embodiment of a method as described herein, exemplary process parameters are described in Table 3.

TABLE 3

Exemplary process parameters for a process according to the embodiment of FIG. 12.

| Parameter | Value |
|---|---|
| Temp [° C.] | 100 |
| Ar [slm] | 4.3-6 |
| RC Press [Pa] | 700-900 |
| Power [W] | 50-100 |
| Precursor 1 on [%] | 100 |
| Precursor 2 on [%] | 10-100 |

In the embodiment of FIG. 12, precursor 1 is toluene, and precursor 2 has a structure according to the following formula:

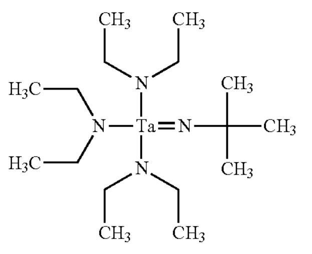

In the embodiment of FIG. 12, the process temperature is 100° C., and argon, which is used as a plasma gas, is provided to the reaction chamber continuously at a flow rate of 4.3 to 6 standard liters per minute (slm). The reaction chamber is maintained at a pressure of at least 700 to at most 900 Pa. A capacitive RF plasma is generated in the reaction chamber at a frequency of 13.56 MHz, and a plasma power of at least 50 to at most 100 W is used. Percentage on time of the first precursor is 100%, and percentage on time of the second precursor was from at least 10% to at most 100%. As before, "percentage on time" refers to the ratio, in percent, of pulse duration over (pulse duration plus inter-pulse interval duration).

FIG. 12 shows that a process according to the present embodiment advantageously results in formation of a gap filling fluid with good flowability. In particular, the flowability was found to be higher than that of precursor 2 as such, which is may not be flowable, i.e. the second precursor may under the reaction conditions used in the process in question, yield a deposited substance which does not show any flowable, liquid, or liquid-like characteristics. In one instance as depicted in FIG. 12, the gap filling fluid has the following composition, in atomic percent: 74.0% C, 17.3% 0, 4.7% Ta, and 2.4% N. It has a density of 1.81 g/cm$^3$; an ashing rate in an $O_2$ plasma of 0.47 nm/s, for a capacitive plasma with the following plasma parameters: 400 Pa pressure, 100 W power, 13.56 MHz plasma frequency, 75° C. substrate temperature; and a shrinkage of 60% after a 30 min Ar anneal at 400° C. It was found that the process parameters according to the embodiment of FIG. 12 can be suitably used to control the composition of a gap filling fluid, in atomic percent, in at least the following range: 0-4.7% Ta, 1.7-17.3% O, 74.0-96.7% C, and 0-2.4% N. The density can be controlled in at least the range of 1.10 g/cm$^3$ to 1.81 g/cm$^3$; the ashing rate in an $O_2$ plasma generated using the aforementioned parameters can be controlled in at least the range of 0.47 nm/s to 0.75 nm/s; while the shrinkage as abovementioned can be controlled in at least the range of 60% to 85%.

In yet a further exemplary embodiment, reference is made to FIG. 13. For a process that can be employed for forming a gap filling fluid according to an embodiment of a method as described herein, exemplary process parameters are described in Table 4.

TABLE 4

Exemplary process parameters for a process according to the embodiment of FIG. 13.

| Parameter | Value |
|---|---|
| Temp [° C.] | 75 |
| Ar [slm] | 4.3-6 |
| RC Press [Pa] | 700-900 |
| Power [W] | 50-100 |
| Precursor 1 on [%] | 100 |
| Precursor 2 on [%] | 10-100 |

In the embodiment of FIG. 13, precursor 1 is toluene, and precursor 2 has a structure according to the following formula:

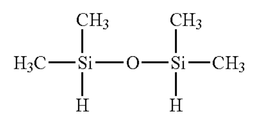

In the embodiment of FIG. 13, the process temperature is 75° C., and argon, which is used as a plasma gas, is provided to the reaction chamber continuously at a flow rate of 4.3 to 6 standard liters per minute (slm). The reaction chamber is maintained at a pressure of at least 700 to at most 900 Pa. A capacitive RF plasma is generated in the reaction chamber at a frequency of 13.56 MHz, and a plasma power of at least 50 to at most 100 W is used. Percentage on time of the first precursor is 100%, and percentage on time of the second precursor was from at least 10% to at most 100%. As before, "percentage on time" refers to the ratio, in percent, of pulse duration over (pulse duration plus inter-pulse interval duration).

FIG. 13 shows that a process according to the present embodiment advantageously results in formation of a gap filling fluid with good flowability. In particular, the flowability was found to be higher than that of precursor 2 as such, which is not flowable under the tested conditions. In one instance as depicted in FIG. 13, the gap filling fluid has the following composition, in atomic percent: 90.3% C, 5.3% O, and 4.3% Si. It was found that the process parameters according to the embodiment of FIG. 13 can be suitably used to control the composition of a gap filling fluid, in atomic percent, in at least the following range: 44.9-97.3% C, 1.3-28.1% O, and 0-27.0% Si.

In yet a further exemplary embodiment, reference is made to FIG. 14. Fora process that can be employed for forming a gap filling fluid according to an embodiment of a method as described herein, exemplary process parameters are described in Table 5.

TABLE 5

| Exemplary process parameters for a process according to the embodiment of FIG. 14. | |
|---|---|
| Temp [° C.] | 90 |
| Precursor 1 Bottle Temp [° C.] | 25 |
| Precursor 2 Bottle Temp [° C.] | 70 |
| Ar [slm] | 4.3-6 |
| RC Press [Pa] | 700-900 |
| Power [W] | 50-100 |
| Precursor 1 on [%] | 100 |
| Precursor 2 on [%] | 10-100 |

In the embodiment of FIG. 14, precursor 1 has as structure according to the following formula:

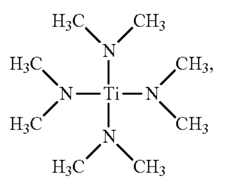

and precursor 2 has a structure according to the following formula:

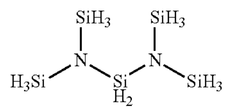

In the embodiment of FIG. 14, the process temperature is 90° C., the bottle temperature of precursor 1 and 2 is respectively 25° C. and 70° C., and argon, which is used as a plasma gas, is provided to the reaction chamber continuously at a flow rate of 4.3 to 6 standard liters per minute (slm). The reaction chamber is maintained at a pressure of at least 700 to at most 900 Pa. A capacitive RF plasma is generated in the reaction chamber at a frequency of 13.56 MHz, and a plasma power of at least 50 to at most 100 W is used. Percentage on time of the first precursor is 100%, and percentage on time of the second precursor was from at least 10% to at most 100%. As before, "percentage on time" refers to the ratio, in percent, of pulse duration over (pulse duration plus inter-pulse interval duration).

FIG. 14 shows that a process according to the present embodiment advantageously results in formation of a gap filling fluid with some flowability. In one instance as depicted in FIG. 14, the gap filling fluid has the following composition, in atomic percent: 42.4% O, 40.9% Si, 11.2% N, 4.8% C, and 0.7% Ti. It has a density of 1.28 g/cm$^3$; a k-value of 3.4 and a breakdown voltage of 6.5 V. It was found that the process parameters according to the embodiment of FIG. 14 can be suitably used to control the composition of a gap filling fluid, in atomic percent, in at least the following range: 0-3.5% Ti, 38.8-61.5% O, 2.4-6.0% C, 2.5-13.1% N and 30.1-42.5% N. The density can be controlled in at least the range of 1.22 g/cm$^3$ to 1.79 g/cm$^3$; the k-value can be controlled in at least the range of 2.8 to 6.1; while the breakdown voltage can be controlled in at least the range of 4.8 V to 10 V.

In still a further exemplary embodiment, reference is made to FIGS. 15(*a*)-(*c*). The second exemplary embodiment above—i.e., with reference to FIGS. 11(*a*) and 11(*b*)—is repeated following the exemplary process parameters are described in Table 2. Precursor 1 is thus toluene, and precursor 2 has a structure according to the following formula:

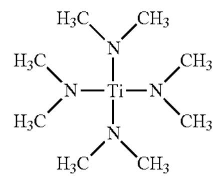

Accordingly, a first sample (sample 1) as depicted in FIG. 15(*a*) is made, in which the gap filling fluid has the following composition, in atomic percent: 75.6% C, 13.4% 0, 7.1% Ti, and 2.9% N. It has a density of 1.32 g/cm$^3$.

The procedure of sample 1 is repeated for sample 2, but using an inter-cycle ash-back (CK) step using an $O_2$ plasma between each deposition cycle. The $O_2$ cyclic ash-back treatment is performed while providing $O_2$ to the reaction chamber at a flow rate of 0.5 standard liters per minute (slm); providing argon to the reaction chamber at a flow rate of 2 slm; maintaining the reaction chamber at a pressure of 400 Pa; and generating a capacitive RF plasma in the reaction chamber at a frequency of 13.56 MHz and a plasma power of 200 W.

Sample 2 is depicted in FIG. 15(*b*), in which the gap filling fluid has the following composition, in atomic percent: 39.4% C, 37.9% 0, 19.4% Ti, and 3.4% N. It has a density of 2.08 g/cm$^3$.

Similarly, the procedure of sample 2 was repeated for sample 3, but using an inter-cycle ash-back (CK) step using an $H_2$ plasma between each deposition cycle. The $H_2$ cyclic ash-back treatment is performed while providing $H_2$ to the reaction chamber at a flow rate of 1 slm; providing argon to the reaction chamber at a flow rate of 2 slm; maintaining the reaction chamber at a pressure of 400 Pa; and generating a capacitive RF plasma in the reaction chamber at a frequency of 13.56 MHz and a plasma power of 100 W.

Sample 3 is depicted in FIG. 15(*c*), in which the gap filling fluid has the following composition, in atomic percent: 50.7% C, 28.0% 0, 15.4% Ti, and 5.8% N. It has a density of 1.54 g/cm$^3$.

Both the $O_2$ and $H_2$ cyclic ash-back were thus effective in reducing the C-content, while increasing the Ti-content—as well as the density—in the gap filling fluid. Further increasing the C-content and increasing the homogeneity of the sample may be done by increasing the number of aching steps for the same amount of gap filling fluid that is deposited.

Although certain embodiments and examples have been discussed, it will be understood by those skilled in the art that the scope of the claims extend beyond the specifically disclosed embodiments to other alternative embodiments and/or uses and obvious modifications and equivalents thereof. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

In the present disclosure, where conditions and/or structures are not specified, the skilled artisan in the art can readily provide such conditions and/or structures in view of the present disclosure, as a matter of routine experimentation.

What is claimed is:

1. A method of filling a gap comprising:

introducing a substrate in a reaction chamber, the substrate being provided with a gap;

introducing a reaction gas in the reaction chamber, the reaction gas comprising a noble gas, a first precursor and a second precursor, the first precursor being different from the second precursor; and, generating a plasma in the reaction chamber, thereby forming a gap filling fluid that at least partially fills the gap, wherein at least one of the first precursor and the second precursor is selected from the group consisting of N,N-diethyl-(1,1,2,3,3,3-hexafluoropropyl)amine, N,N-diethyl-(E)-pentafluoropropenylamine, and combinations thereof.

2. The method according to claim 1, wherein the reaction gas further comprises a third precursor, wherein the third precursor is different from the first and second precursors.

3. The method according to claim 1, wherein the plasma is generated intermittently.

4. The method according to claim 1, wherein the plasma is generated continuously.

5. The method according to claim 1, wherein at least one of the first precursor and the second precursor is intermittently provided to the reaction chamber.

6. The method according to claim 1, wherein at least one of the first precursor and the second precursor is continuously provided to the reaction chamber.

7. The method according to claim 1, which is carried out at a temperature of at least −25° C. to at most 150° C.

8. The method according to claim 1, which is carried out at a pressure of at least 500 Pa.

9. The method according to claim 1, wherein the noble gas is selected from the group consisting of He, Ne, Ar, and Kr.

10. The method according to claim 1 further including a step of curing the gap filling fluid such that a carbon concentration of a cured gap filling fluid is reduced with respect to an uncured gap filling fluid.

11. The method according to claim 1, wherein the substrate comprises a semiconductor.

12. The method according to claim 1, wherein the method comprises one or more cycles, wherein a cycle comprises a gap fill fluid forming step and a curing step, wherein the gap fill fluid forming step comprises introducing the reaction gas in the reaction chamber and the curing step comprises generating the plasma in the reaction chamber.

13. A method of filling a gap comprising:

introducing a substrate in a reaction chamber, the substrate being provided with a gap;

introducing a reaction gas in the reaction chamber, the reaction gas comprising a noble gas, a first precursor and a second precursor, the first precursor being different from the second precursor; and, generating a plasma in the reaction chamber, thereby forming a gap filling fluid that at least partially fills the gap, wherein:

the first precursor is N,N-diethyl-(1,1,2,3,3,3-hexafluoropropyl)amine and the second precursor is N,N-diethyl-(E)-pentafluoropropenylamine; or the first precursor is N,N-diethyl-(1,1,2,3,3,3-hexafluoropropyl)amine and the second precursor is a metal precursor, or the first precursor is N,N-diethyl-(E)-pentafluoropropenylamine and the second precursor is a metal precursor.

14. The method according to claim 13, wherein:

the first precursor is N,N-diethyl-(1,1,2,3,3,3-hexafluoropropyl)amine and the second precursor is a metal precursor, or the first precursor is N,N-diethyl-(E)-pentafluoropropenylamine and the second precursor is a metal precursor, and wherein the metal precursor comprises titanium, hafnium, zirconium, or tantalum.

15. The method according to claim 14, wherein the metal precursor comprises a tantalum precursor.

16. The method according to claim 15, wherein the tantalum precursor is selected from a tantalum alkylamine, a tantalum alkylamine comprising at least two different alkylamine ligands, a heteroleptic alkylamine, and a tantalum halide.

17. The method according to claim 16, wherein the tantalum precursor is $TaCl_5$.

18. The method according to claim 16, wherein the tantalum precursor is a tantalum alkylamine.

19. The method according to claim 18, wherein the tantalum precursor is tris(diethylamido)(tert-butylimido) tantalum.

20. The method according to claim 14, wherein the reaction gas further comprises a third precursor, wherein the third precursor is different from the first precursor and the second precursor.

* * * * *